(12) United States Patent
Wang et al.

(10) Patent No.: US 11,245,038 B2
(45) Date of Patent: Feb. 8, 2022

(54) VERTICAL MULTI-GATE THIN FILM TRANSISTORS

(71) Applicant: Intel Corporation, Santa Clara, CA (US)

(72) Inventors: Yih Wang, Portland, OR (US); Abhishek Sharma, Hillsboro, OR (US); Sean Ma, Portland, OR (US); Van H. Lee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 333 days.

(21) Appl. No.: 16/490,503

(22) PCT Filed: Mar. 30, 2017

(86) PCT No.: PCT/US2017/024969
§ 371 (c)(1),
(2) Date: Aug. 30, 2019

(87) PCT Pub. No.: WO2018/182609
PCT Pub. Date: Oct. 4, 2018

(65) Prior Publication Data
US 2020/0044095 A1    Feb. 6, 2020

(51) Int. Cl.
*H01L 29/786* (2006.01)
*H01L 27/108* (2006.01)
*H01L 29/66* (2006.01)

(52) U.S. Cl.
CPC .. *H01L 29/78642* (2013.01); *H01L 27/10823* (2013.01); *H01L 27/10876* (2013.01); *H01L 27/10891* (2013.01); *H01L 29/66742* (2013.01)

(58) Field of Classification Search
CPC ......... H01L 29/78642; H01L 27/10823; H01L 27/10876; H01L 27/10891;
(Continued)

(56) References Cited

U.S. PATENT DOCUMENTS

| 5,563,077 A | 10/1996 | Ha |
| 2006/0068531 A1 | 3/2006 | Breitwisch et al. |

(Continued)

OTHER PUBLICATIONS

International Preliminary Report on Patentability from PCT/US2017/024969 dated Oct. 10, 2019.
(Continued)

*Primary Examiner* — Robert G Bachner
(74) *Attorney, Agent, or Firm* — Essential Patent Group, LLP

(57) ABSTRACT

Vertical thin film transistors (TFTs) including a gate electrode pillar clad with a gate dielectric. The gate dielectric is further clad with a semiconductor layer. Source or drain metallization is embedded in trenches formed in an isolation dielectric adjacent to separate regions of the semiconductor layer. During TFT operation, biasing of the gate electrode can induce one or more transistor channel within the semiconductor layer, electrically coupling together the source and drain metallization. A width of the channel may be proportional to a height of the gate electrode pillar clad by the semiconductor layer, while a length of the channel may be proportional to the spacing between contacts occupied by the semiconductor layer. In some embodiments, a memory device may include cells comprising a vertical thin film select transistor and a capacitor (1TFT-1C).

25 Claims, 15 Drawing Sheets

(58) Field of Classification Search
CPC ........... H01L 29/66742; H01L 27/1222; H01L 27/10873; H01L 29/66969
See application file for complete search history.

(56) References Cited

U.S. PATENT DOCUMENTS

2015/0249143 A1 9/2015 Sano et al.
2016/0308064 A1 10/2016 Shimabukuro
2016/0365459 A1 12/2016 Hong et al.

OTHER PUBLICATIONS

International search Report and Written Opinion, dated Dec. 22, 2017, for International Patent Application No. PCT/US2017/024969.

US 11,245,038 B2

VERTICAL MULTI-GATE THIN FILM TRANSISTORS

CLAIM OF PRIORITY

This Application is a National Stage Entry of, and claims priority to, PCT Patent Application No. PCT/US2017/024969, filed on Mar. 30, 2017 and titled "VERTICAL MULTI-GATE THIN FILM TRANSISTORS", which is incorporated by reference in its entirety for all purposes.

BACKGROUND

Thin-film transistors (TFTs) are a class of field-effect transistors (FETs) in which the channel semiconductor material is a deposited amorphous or polycrystalline thin film rather than a monocrystalline material. A common application of TFT technology is liquid crystal displays (LCDs), but TFTs are also advantageous in other applications as the thin film deposition processes employed in TFT fabrication can be relatively low (e.g., below 450° C.), allowing TFTs to be inserted within layers of interconnect metallization of the type that is typically formed only after higher-temperature processing is completed in conventional silicon MOSFET fabrication technology.

One conventional TFT architecture includes a planar bottom gate electrode, which is typically embedded in an interlayer dielectric (ILD) layer. A semiconductor film is deposited over the ILD layer and over the gate electrode (with a gate dielectric there between). Source and drain contacts are then landed on the semiconductor on either side of the gate electrode. Several challenges face such architectures. For example, there is extrinsic resistance variation associated with error and/or variability in the positioning of the source and drain contacts relative to the gate electrode. There is also intrinsic resistance and/or drive current variation associated with error and/or variability in the critical dimension of the gate electrode. Such challenges become greater with the scaling of a TFT. As such, applications requiring highly-scaled TFTs have yet to be made commercially available.

BRIEF DESCRIPTION OF THE DRAWINGS

The material described herein is illustrated by way of example, and not by way of limitation, in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
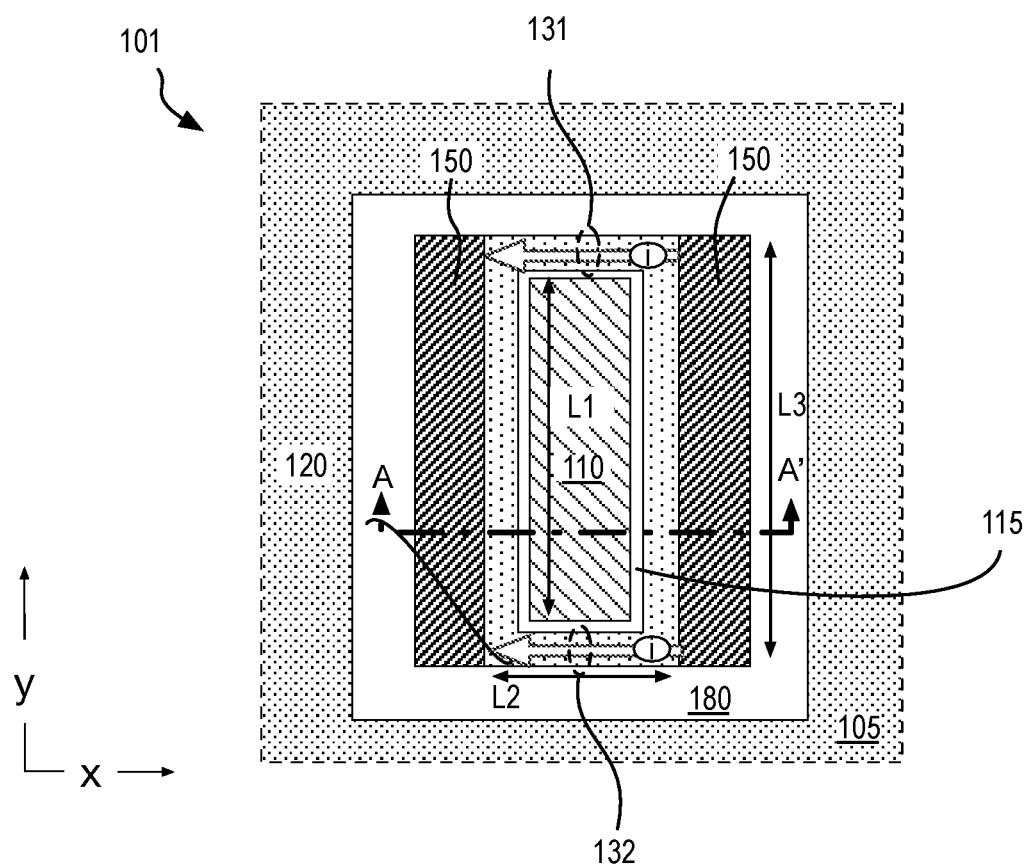
FIG. 1A illustrates a top-down plan view of a vertical thin film transistor structure, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material "on" a second material is in direct contact with that second material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Vertical thin film transistor (TFTs) structures are described herein. The vertical TFTS include a gate electrode clad with a gate dielectric. The gate dielectric is further clad with a semiconductor layer. Source or drain metallization is embedded in trenches formed in an isolation dielectric adjacent to separate regions of the semiconductor layer. During TFT operation, biasing of the gate electrode can induce one or more transistor channel within the semiconductor layer, electrically coupling together the source and drain metallization. A width of the channel may be proportional to a height of the gate electrode pillar clad by the semiconductor layer, while a length of the channel may be proportional to the spacing between contacts occupied by the semiconductor layer. In some embodiments, a memory device may include cells comprising a vertical thin film select transistor and a capacitor (1TFT-1C).

Figure 1B:
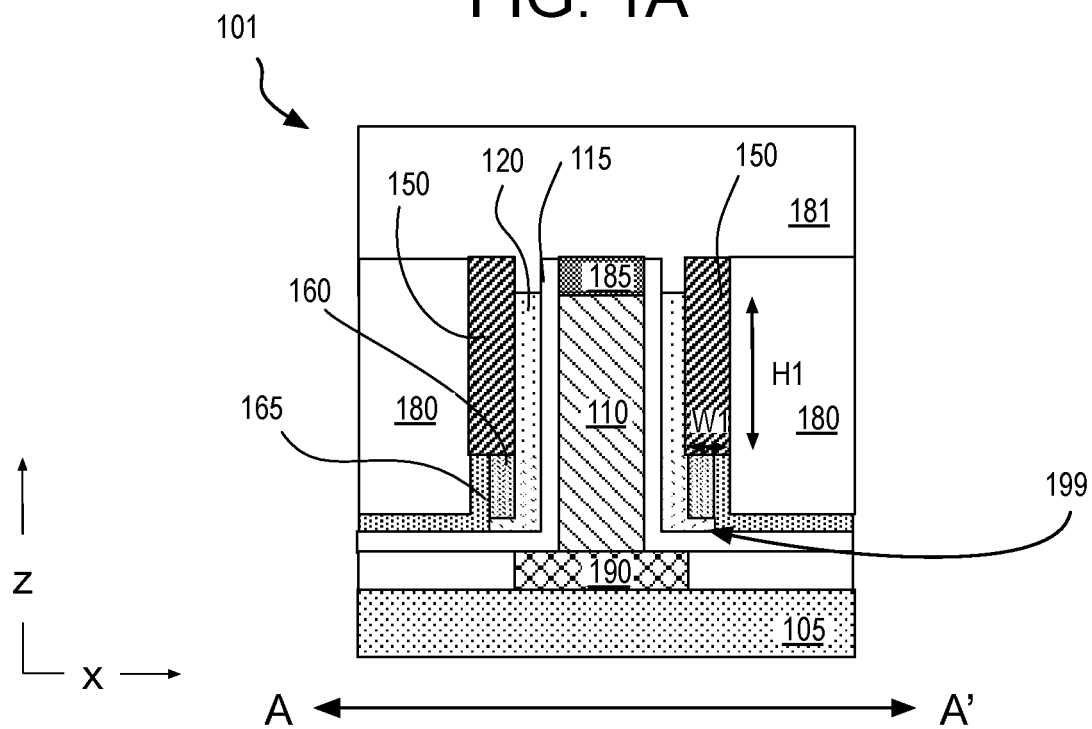
FIG. 1B illustrates a cross-sectional view of the vertical thin film transistor structure shown in FIG. 1A, in accordance with some embodiments.

FIG. 1A illustrates a top-down plan view of a vertical thin film transistor structure 101, in accordance with some embodiments. FIG. 1B illustrates a cross-sectional view of the vertical thin film transistor structure 101 along the A-A' shown in FIG. 1A, in accordance with some further embodiments. Vertical gate thin film transistor structure 101 has a gate electrode 110. Gate dielectric 115 surrounds at least a portion of the sidewall of gate electrode 110. A semiconductor layer 120 surrounds at least a portion of gate dielectric 115. Source and drain contact metallization 150 makes contact with two separate portions of semiconductor layer 120, and a field dielectric material 180 physically and electrically separates contact metallization 150. As such, during transistor operation, a gate bias (e.g., 0.5-2.0V) applied to gate electrode 110 may induce a conductive channel within semiconductor layer 120. Majority charge carriers (e.g., electrons) may transit any portion of the channel coupling together the source and drain contact metallization 150. When in an "on" state, current may flow through one or more portions of semiconductor layer 120, wherever there is sufficient field. In the example shown in FIG. 1A, highest current density is found in a first channel 131, and a second channel 132, which are located on the opposite short ends of gate electrode 110. As further shown in FIG. 1B, with the vertical orientation, transistor channel width may be proportional to the vertical height (e.g., z-dimension) of the gate electrode and the overlap of the gate electrode with the contact metallization 150 (e.g., H1). As described further below, channel width may also be proportional to the number of gate electrodes located between source and drain contact metallization 150. As the channel width is not dependent on a planar dimension, vertical thin film transistor structure 101 is more scalable and, as a result well-suited to applications such as an access (select) transistor in memory devices.

As shown in FIGS. 1A and 1B, vertical thin film transistor structure 101 is located over a substrate 105. Substrate 105 may be any substrate known to be suitable for hosting a thin film transistor, such as, but not limited to, monocrystalline substrates (e.g., silicon, germanium, SiGe, SiC, sapphire), glass substrates (e.g., silica, alumina), or organics (e.g., polyimide, SU-8). In some exemplary embodiments, substrate 105 includes integrated circuitry, such as, but not limited to, MOSFET (e.g., CMOS) integrated circuitry including a plurality of FETs fabricated in a monocrystalline semiconductor material and one or more levels of conductive interconnect structures (e.g., metallization) embedded in one or more interlevel dielectric (ILD) layers.

Gate electrode 110 is located over an underlying layer of substrate 105, for example over an underlying ILD layer. In some embodiments, as described further below, gate electrode 110 may make contact with an underlying metallization level embedded within the underlying ILD layer. Gate electrode 110 may have any composition known to be suitable for controlling the channel conductivity of a thin film transistor. Gate electrode 110 may have any suitable work function and may include a doped semiconductor (e.g., polysilicon), or an elemental metal layer, a metal alloy layer, and/or laminate structure. In some embodiments, the gate electrode 110 comprises a metal nitride, such as TiN. A gate electrode may also comprise Al (e.g., TiAlN). Other alloy constituents may also be employed, such as, but not limited to, C, Ta, W, Pt, and Sn. One or more dielectric cap layers may be present over a top surface of gate electrode 110. A dielectric cap 185 is shown in FIG. 1B. Gate electrode 110 may have any feature dimensions. As shown in FIG. 1A, gate electrode 110 has a longitudinal length $L_1$ and a transverse width $L_2$. In the example illustrated, channel length of transistor structure 101 is primarily a function of transverse width $L_2$. In some embodiments, transverse width $L_2$ is less than 20 nm, and advantageous less than 15 nm. Longitudinal length $L_1$ may, in some embodiments, be larger than $L_2$, for example where gate electrode 110 is patterned as a 2D grating pattern.

Gate dielectric 115 surrounds gate electrode 110, forming a cladding around at least a sidewall of gate electrode 110.

As shown in FIGS. 1A and 1B, gate dielectric 115 is absent from the top surface of gate electrode 110. However, in some alternative embodiments, gate dielectric 115 may cover the top surface of gate electrode 110. As visible in FIG. 1B, gate dielectric 115 extends over the underlying surface of substrate 105 and is not confined to sidewalls of gate electrode 110. While any gate dielectric materials known to be suitable for gate electrode 110 and semiconductor layer 120 may be utilized, in some exemplary embodiments gate dielectric 115 includes at least one layer of a high-k dielectric material (e.g., having a bulk relative permittivity greater than 9). Exemplary high-k materials include electrically resistive metal oxides, such as, but not limited to, $Al_2O_3$, $HfO_2$, and $HfAlO_x$.

Semiconductor layer 120 surrounds gate dielectric 115, forming another cladding layer around at least a sidewall of gate electrode 110. As shown in FIGS. 1A and 1B, semiconductor layer 120 is absent from the top surface of gate electrode 110. However, in some alternative embodiments, semiconductor layer 120 (and gate dielectric 115) may cover the top surface of gate electrode 110. As shown in FIG. 1B, semiconductor layer 120 is also absent from some regions of the underlying surface so as to be localized to transistor structure 101 and electrically insulated from any adjacent structures (e.g., other transistors). In some embodiments therefore, semiconductor layer 120 is present only around the sidewall of gate electrode 110 (separated by gate dielectric 115). In the example shown in FIG. 1B, semiconductor layer 120 has a foot 199, which is indicative of the process employed to remove semiconductor layer 120. As described further below in the context of transistor fabrication, foot 199 may extend a few nanometers from the sidewall of gate electrode 110 as a result of masking by a dielectric spacer 160. Dielectric spacer 160 may have any composition (e.g., silicon oxide (SiO), silicon nitride (SiN), silicon oxynitride (SiON), carbon-doped silicon oxide (SiOC(H)). In some advantageous embodiments, dielectric spacer 160 has a different composition than dielectric cap 185, enabling dielectric spacer 160 to be etched selectively over dielectric cap 185. In some embodiments, dielectric spacer 160 is a material capable of passivating surfaces of semiconductor layer 120. As such, the composition of dielectric spacer 160 may depend upon the composition of semiconductor layer 120. For some exemplary embodiments where semiconductor layer 120 is an amorphous or polycrystalline oxide semiconductor, dielectric spacer 160 is an insulative (non-semiconducting) metal oxide. In some such embodiments, dielectric spacer 160 includes at least one of Al (e.g., $AlO_x$), Ti (e.g., $TiO_x$) or Hf (e.g., $HfO_x$) and may be a suboxide ($A_2O$), monoxide (AO), binary oxide ($AO_2$), ternary oxide ($ABO_3$), or mixture thereof.

While transistor structure 101 may employ any thin film semiconductor material as semiconductor layer 120, including traditional group IV semiconductor materials such as silicon (Si), germanium (Ge), and SiGe alloys, TFT performance depends on the composition of the semiconductor employed as the transistor channel material. This may be particularly important where transistor structure 101 is highly scaled (e.g., $L_2$ of 10-15 nm) as some thin film semiconductor materials will suffer exceedingly high leakage current at such dimensions. In some exemplary embodiments, semiconductor layer 120 is an oxide semiconductor. An oxide semiconductor is a semiconducting oxide, or a semiconductor comprising oxygen. For such embodiments, the wide band gap of oxide semiconductors has the advantage of low leakage. In such materials the minority carrier population is vanishingly small compared to that of materials such as silicon and germanium, making the vertical transistor structure 101 essentially an exclusively majority carrier device. With virtually no minority carriers, majority-minority carrier recombination is low and off-state leakage current potentially significant. In addition to the low-leakage of oxide semiconductor materials enabling dimensional scaling of transistor structure 101, oxide semiconductor materials may enable higher memory cell retention rates at higher memory density. Semiconducting properties vary with the oxide semiconductor composition and microstructure of semiconductor layer 120. Semiconductor layer 120 may be amorphous (i.e., having no structural order), or polycrystalline (e.g., having micro-scale to nano-scale crystal grains).

Exemplary oxide semiconductors include metal oxides with a transition metal (e.g., IUPAC group 4-10) or post-transition metal (e.g., IUPAC groups 11-15). In advantageous embodiments, the metal oxide includes at least one of Mg, Cu, Zn, Sn, Ti, Ni, Ga, In, Sb, Sr, Cr, Co, V, or Mo. The metal oxides may be suboxides ($A_2O$), monoxides (AO), binary oxides ($AO_2$), ternary oxides ($ABO_3$), and mixtures thereof. Semiconductor layer 120 may be a p-type, n-type, or intrinsic material. In exemplary embodiments, semiconductor layer 120 is n-type as a number of oxide semiconductors have been found to be capable of significant electron densities. Some oxide semiconductors have also been found to be capable of significant electron hole densities. Many oxide semiconductors have high defect density nearer the valence band, but display good n-type electrical properties. Some oxide semiconductors have high defect density in the conduction band, but display good p-type electrical properties. In some embodiments, semiconductor layer 120 comprises a tin oxide ($SnO_x$), such as Tin (IV) oxide, or $SnO_2$. In other embodiments, the tin oxide is Tin (II) oxide (SnO) or a mixture of SnO and $SnO_2$, where x may range between 1 and 2. While the range of x may be expanded, semiconducting properties may be lost (e.g., the material becomes a pure conductor if x is to low, and a pure insulator if x is too high). In some other embodiments, semiconductor layer 120 comprises a zinc oxide ($ZnO_x$), such as Zn(II) oxide, or ZnO. In other embodiments, the zinc oxide is zinc dioxide ($ZnO_2$) or a mixture of ZnO and $ZnO_2$, where x may range between 1 and 2. In some embodiments where semiconductor layer 120 comprises $ZnO_x$, the dopants may include In and Ga. In some specific examples, semiconductor layer 302 is $InGaO_3(ZnO)_5$, often referred to simply as IGZO. In some other embodiments, semiconductor layer 120 comprises titanium oxide ($TiO_x$), or $SnO_x$. Exemplary oxide semiconductors that may have suitable p-type conductivity include copper oxide ($CuO_x$). In some $CuO_x$ embodiments, semiconductor layer 120 is Cu(I) oxide, or $Cu_2O$. In other embodiments, semiconductor layer 120 is Cu(II) oxide (CuO) or a mixture of CuO and $Cu_2O$, where x may range between 0.5 and 1. Still other exemplary oxide semiconductor compositions include $NiO_x$.

Although not bound by theory, the basis for semi-conductivity in many oxide semiconductors may be the presence of oxygen vacancies. The presence of other electrically active dopants, such as hydrogen, or one or more metal species, may also serve as a means of tuning the semiconducting properties of the oxide semiconductor. Semiconductor layer 120 or various portions thereof (e.g., regions contacted by contact metallization 150) may be intentionally doped (e.g., through one or more surface treatments). Compared to intrinsic oxide semiconductor that is not intentionally doped, n-type and p-type oxide semiconductors may have a higher concentration of impurities, such as, but not limited to, one or more group III element, group V element, and/or elemental hydrogen (H), and/or oxygen vacancies. Dopant levels in semiconductor layer 120 may also be selected to arrive at an optimal threshold voltage associated with gating the semiconductor within the channel and/or for lowest bulk and/or junction resistance within the semiconductor source and/or drain junction with contact metallization 150.

As shown in FIGS. 1A and 1B, contact metallization 150 is located within trenches exposing semiconductor layer 120 along portions of the cladded sidewall of gate electrode 110. As for semiconductor layer 120, contact metallization 150 is absent from a top surface of gate electrode 110. In the embodiment shown in FIG. 1A, contact metallization 150 is also absent from a top surface of semiconductor layer 120, and therefore only makes contact to semiconductor layer 120 along a sidewall of gate electrode 110, as further shown in FIG. 1B. As shown, contact metallization 150 fills a trench of lateral width W1 that is at least equal to the thickness of the dielectric spacer 160 (as measured normal from the sidewall of gate electrode 110). In the exemplary embodiment, contact metallization 150 fills a trench of lateral width W1 that is substantially equal to the thickness of the dielectric spacer 160 and a dielectric liner 165. Dielectric liner 165 may have any composition (e.g., SiO, SiN, SiON, SiCO(H), etc.). In some advantageous embodiments, dielectric liner 165 has the same composition as dielectric spacer 160, facilitating the contact trench etch and/or improving surface passivation of semiconductor layer 120.

Unlike semiconductor layer 120, contact metallization 150 is discontinuous about the perimeter or periphery of the cladded gate electrode. Rather than a continuous cladding, which would prevent contact metallization 150 from sustaining a voltage differential across semiconductor layer 120, contact metallization 150 is spaced apart either by portions of semiconductor layer 120 or dielectric spacer 160, and/or 165, and/or 180. A first contact metallization 150 may be associated with a first of a source and drain of transistor structure 101, while a second contact metallization 150 may be associated with a second of a source and drain of transistor structure 101. Contact metallization 150 may have any composition known to provide a suitable contact to semiconductor layer 120. Contact metallization 150 may form a schottky or ohmic junction with an interface of semiconductor layer 120. Contact metallization 150 may include, for example, one or more metals or metallic compounds. In some embodiments, contact metallization 150 includes a metal nitride at the interface of (i.e., in direct contact with) semiconductor layer 120. Metal nitrides may offer good stability and do not readily oxidize. Exemplary metal nitrides include TiN, TaN, and WN. In other exemplary embodiments, contact metallization 150 includes a noble metal (e.g., Pt) at the interface of (i.e., in direct contact with) semiconductor layer 120.

Isolation dielectric of structure 101 may include one or more conformal or non-conformal dielectric material layers surrounding semiconductor layer 120 and contact metallization 150. Any dielectric material known to be suitable for electrically insulating adjacent transistors of an IC may be employed as isolation dielectric. In the example shown in FIG. 1B, the isolation dielectric includes a dielectric spacer 160, a dielectric liner 165 (both of which are conformal dielectric layers) and field dielectric 180 (which is non-conformal). In some advantageous embodiments, field dielectric 180 has a different composition than dielectric spacer 160 and/or dielectric liner 165, facilitating formation of a trench to contain the contact metallization by an etch process that is selective to the spacer and/or liner dielectric over field dielectric 180. Field dielectric 180 is advantageously a material that is flowable or can otherwise planarize structure 101 with surrounding features. In some embodiments, field dielectric 180 includes one or more layer of one or more of SiO, SiN, SiON, SiOC(H), polyimide, HSQ, or MSQ.

Figure 2:
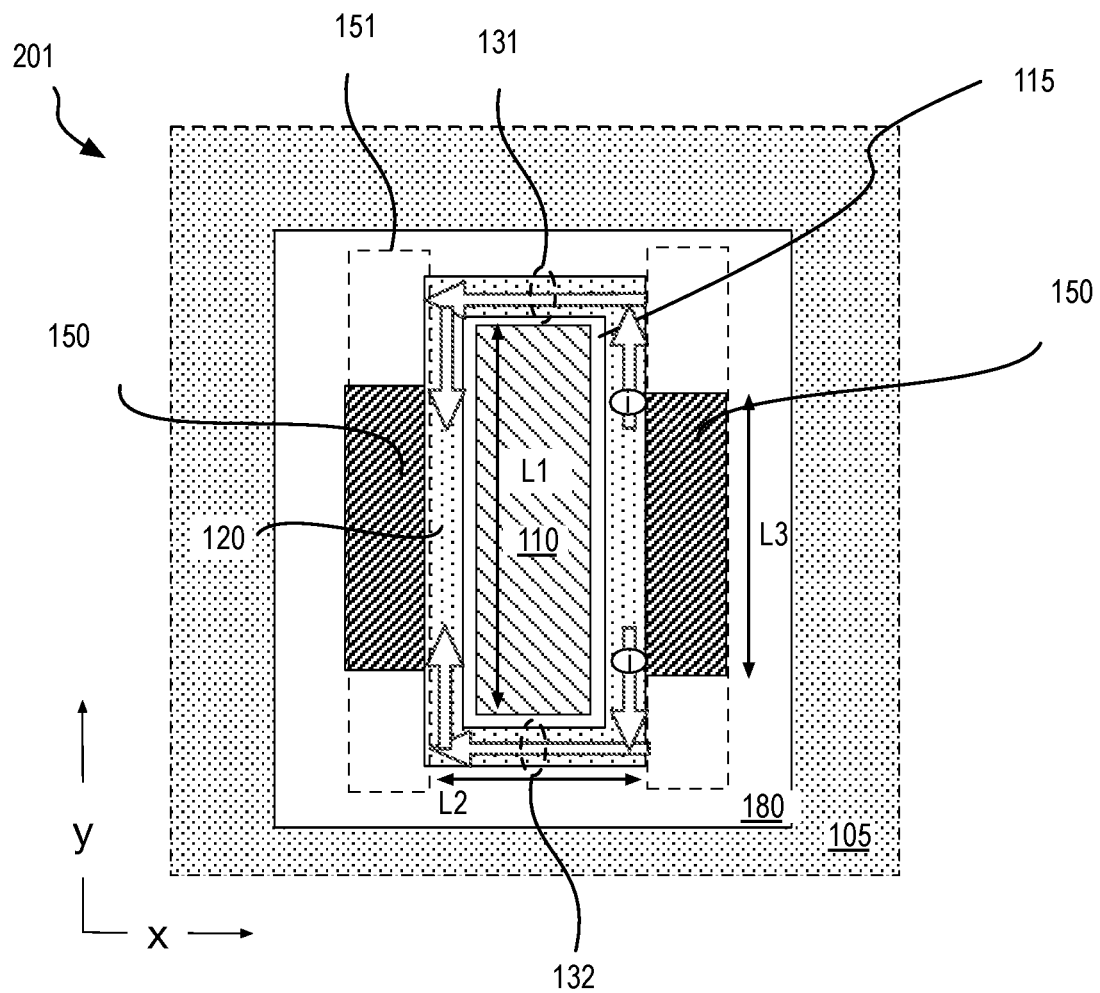
FIG. 2 illustrates a top-down plan view of a vertical thin film transistor, in accordance with some alternative embodiments.

While FIGS. 1A and 1B illustrate an exemplary alignment of contact metallization 150 to the cladded gate electrode 110, the relative alignment and dimensions of structural elements introduced in FIGS. 1A and 1B may deviate without departing from the scope of the present embodiments. For example, FIG. 2 illustrates a top-down plan view of a vertical thin film transistor structure 201, in accordance with some alternative embodiments where the longitudinal lengths of contact metallization 150 are significantly shorter than shown in FIG. 1A. For structure 201, contact metallization 150 have a longitudinal length L3 that is significantly less than L1 of gate electrode 110. As such, the effective lengths of channels 131, 132 are greater than L2, but remain of approximately of equal length. While structure 201 is a possible variation of the structure 101, alternatives where contact metallization 150 have longitudinal lengths at least equal to that of gate electrode 110 (e.g., as shown in FIG. 1A), or greater than that of gate electrode 110 (e.g., dashed lines 151 in FIG. 1B), may be more tolerant of potential misalignment of contact metallization (e.g., in the y-dimension). As described further below, contact metallization 150 can be fabricated in an at least partially self-aligned manner so that variation in the transverse width L2 is minimal.

Figure 3:
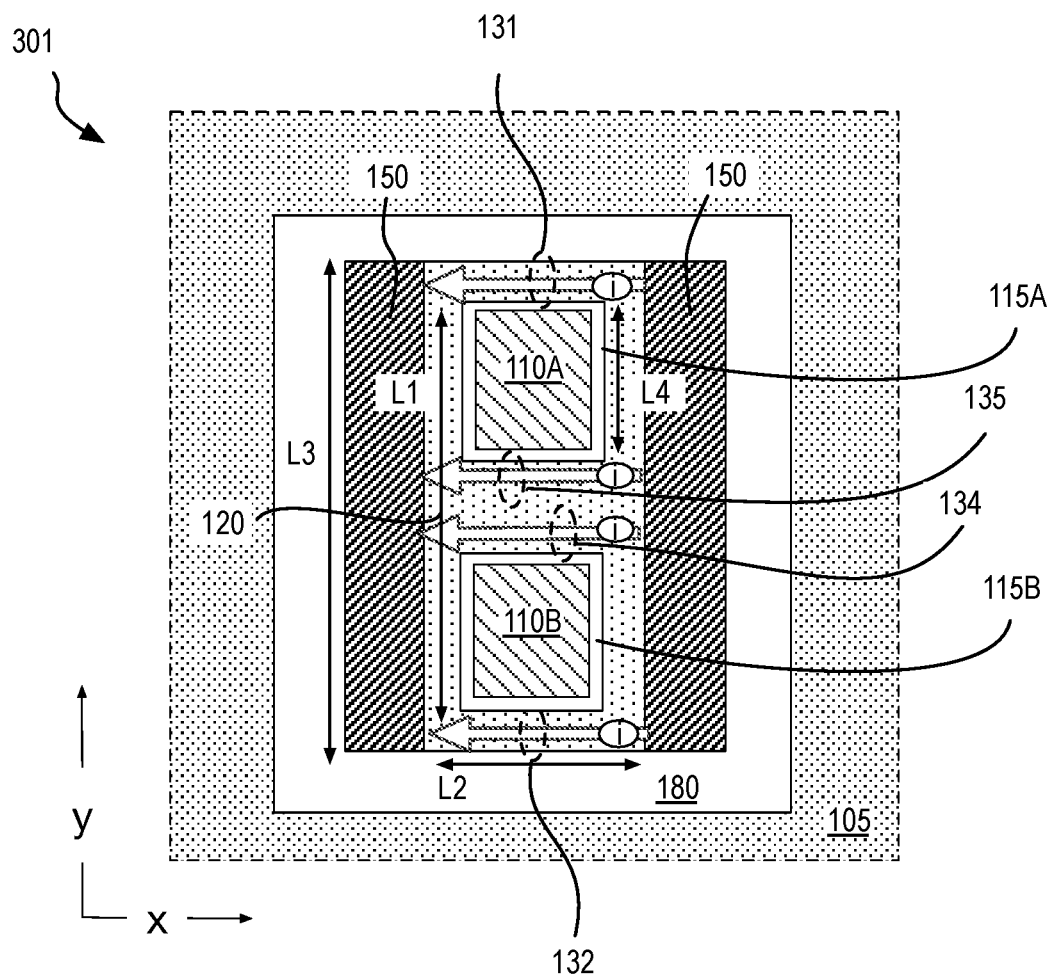
FIG. 3 illustrates a top-down plan view of a vertical quad-gate thin film transistor, in accordance with some embodiments.

As noted above, transistor structures 101 and 201 have two channels 131, 132 and may therefore be classified as dual-gate or, more generally, multi-gate transistors. The number of channels may be further increased by increasing the number of gate electrodes spanning the longitudinal length of the contact metallization (e.g., the number of gate electrodes within the length L3). FIG. 3 illustrates a top-down plan view of a vertical quad-gate thin film transistor structure 301, in accordance with some embodiments. Vertical thin film transistor structure 301 includes a first gate electrode 110A laterally spaced apart from a second gate electrode 110B. Each of gate electrodes 110A and 110B may be separate pillars extending from an underlying surface of substrate 105. Gate electrodes 110A and 110B may each have any of the properties described above for gate electrode 110. A gate dielectric 115A and 115B dads at least a sidewall of gate electrode 110A and 110B, respectively. Gate dielectrics 115A, 115B may have any of the properties described above in the context of gate dielectric 115. At least a sidewall of these dielectric-clad gate electrodes are further surrounded by semiconductor layer 120, which may have any of the properties described above.

Contact metallization 150 contacts two separate, discrete regions of semiconductor layer 120. As shown, contact metallization 150 have a longitudinal length L3 that exceeds the longitudinal length L4 of each gate electrode 110A, 110B. Contact longitudinal length L3 is at least equal to the total longitudinal length of both gate electrodes 110A and 110B (e.g., twice L4), and as shown, may be equal to (or greater than) the total length of gate electrodes 110A, 110B added to the spacing between gate electrodes 110A, 110B (e.g., L1). In the exemplary embodiment shown, the spacing between gate electrodes 110A and 110B is completely occupied by semiconductor layer 120. With sufficient spacing between gate electrodes 110A, 110B, two distinct semiconductor layers 120 may be present, and dielectric material may even intervene within the space between gate electrodes 110A, 110B. Regardless, two additional channels 134 and 135 will be operable upon appropriate biasing of gate electrodes 110A, 110B. Current may be therefore conducted between source and drain contact metallization 150 by way of the four transistor channels 131, 132, 134, and 135. Each of these channels may have substantially the same channel length, which is a function of transverse width L2. Each of these channels may have substantially the same channel width, which is a function of the overlap in the z-dimension between the gate electrodes 110A, 110B and semiconductor layer(s) 120.

Figure 4:
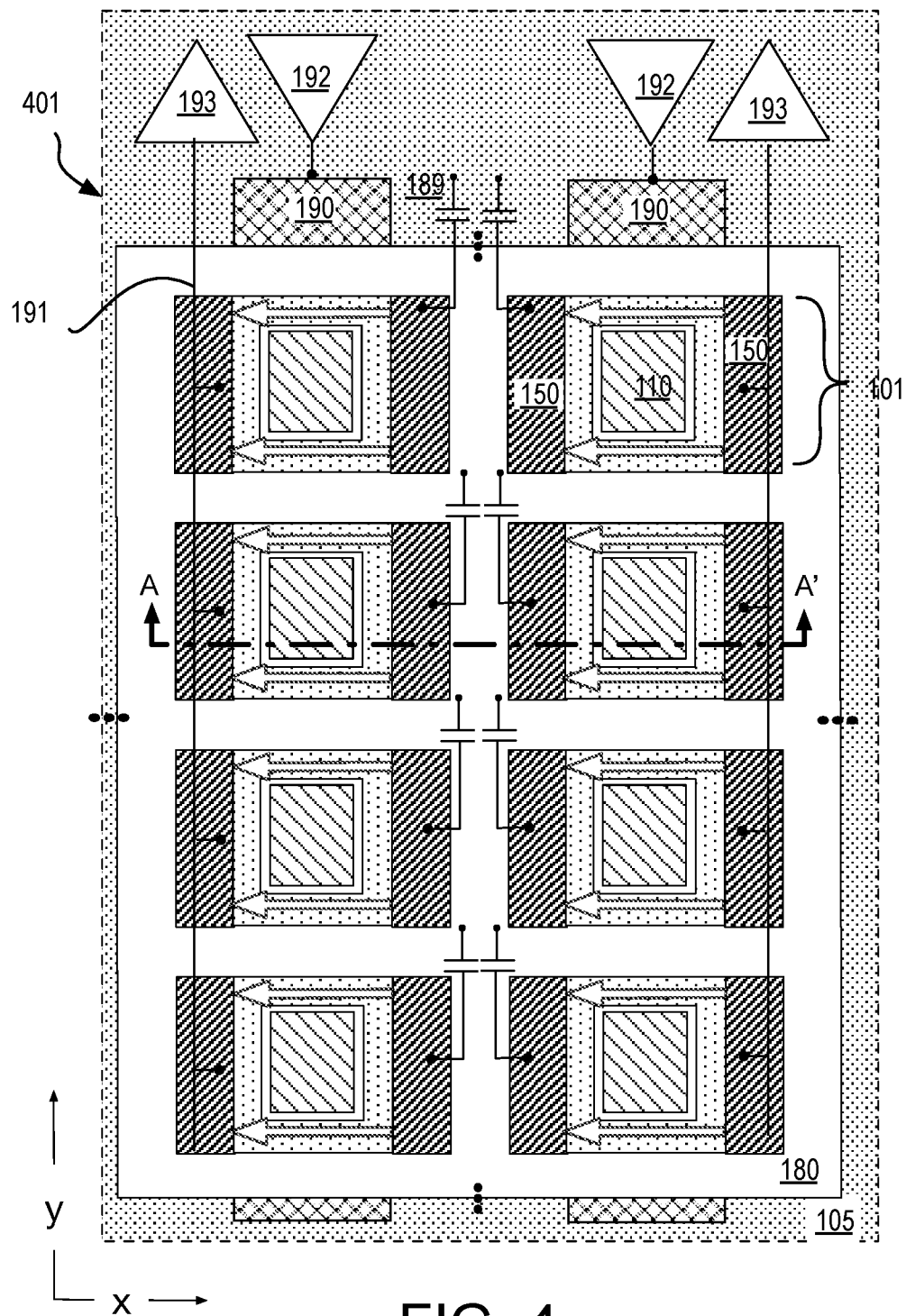
FIG. 4 illustrates a top-down plan view of vertical thin film transistor array, in accordance with some embodiments.

FIG. 4 illustrates a top-down plan view of memory device 401 including a vertical thin film transistor array, in accordance with some embodiments. As shown, memory device 401 includes a plurality of memory cells, each cell including a vertical thin film transistor structure 101 and a charge storage capacitor 189. Vertical transistor structures 101 may be arranged in a 2D array, as shown, or in an alternative layout. In some embodiments, vertical transistor structures 101 are configured as select or access transistors in 1TFT-1C cells of a DRAM. Transistor structures 101 may be networked with storage capacitors 189 by conductive traces including wordlines 190 and bitlines 191. Wordlines 190 may be electrically connected to transistor structures 101 through a bottom surface of gate electrodes 110. Wordlines 190 may be further electrically connected to row circuitry, such as wordline drivers 192. Bitlines 191 may be electrically coupled to a first (e.g., drain) contact metallization 150. Bitlines 191 may be further electrically connected to column circuitry, such as sense amplifiers 193. A second (e.g., source) contact metallization 150 may be coupled to a terminal of a capacitor 189. Transistor structure 101 may then be operable as a select transistor where wordline drivers 192 are operable to bias wordlines 190 between a voltage sufficient to turn off a select transistor and a voltage sufficient to turn on the select transistor. For example, wordlines 190 may be coupled to a wordline driver 192 operable to bias the wordline 190 between a negative voltage (e.g., between 0V and −0.5V) sufficient to turn off an n-type transistor, and a positive voltage (e.g., between 0.5V and 2V) sufficient to turn on an n-type transistor.

In some embodiments, memory device 401 is fabricated in the BEOL interconnect levels of an IC chip. Hence, all of capacitors 20, bitlines 191, wordlines 190, and select transistor structures 101 are fabricated within, and/or between, various interconnect metallization levels. In further embodiments, peripheral memory circuitry including at least one of column circuitry and row circuitry, is fabricated in a device level that falls within at least some of the footprint of memory device 401. For example, bitlines 191 may be electrically coupled to a sense amplifier 193 that employs MOSFETs fabricated in a region of a monocrystalline semiconductor device layer (e.g., silicon substrate) that is at least partially underlying memory array 100. In further embodiments, wordlines 190 are electrically coupled to wordline drivers 192 that employ MOSFETs fabricated in a region of a monocrystalline semiconductor device layer of substrate 105 that is at least partially underlying the 2D array of transistor structures 101.

Memory device 401 may have any storage capacity (i.e., any number of bit cells) and one or more memory device 401 may be fabricated on a single IC chip. In some embodiments, for example, memory device 401 includes between 256 and 1024 wordlines and between 1024 and 4096 bitlines. A memory device architecture employing TFTs in the memory array enables vertical integration of the peripheral circuitry. A gain in memory density is then possible where the TFT array has sufficient density.

Figure 5:
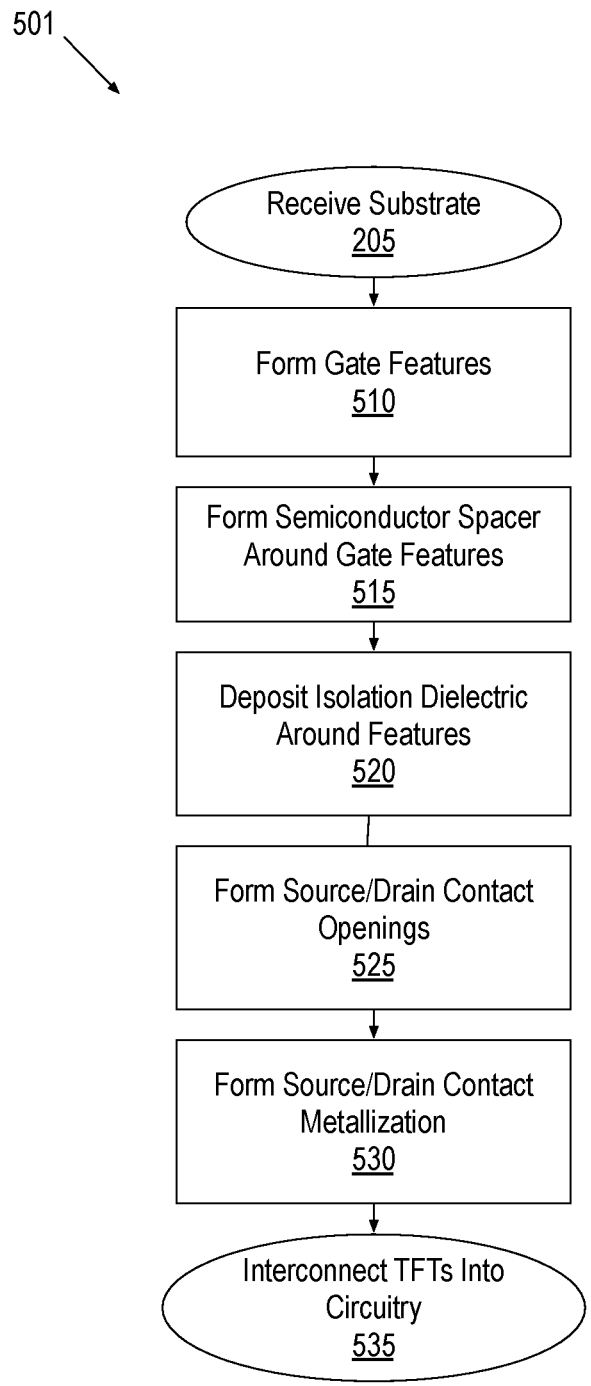
FIG. 5 is a flow diagram illustrating methods for fabricating vertical thin film transistors, in accordance with some embodiments.

With certain structural features of a vertical TFT and a memory device employing such vertical TFTs described above, the fabrication of such features is further described below. Self-aligned etch processes and/or damascene techniques, which are all highly scalable, may be enlisted to fabricate many vertical thin film transistor structures. FIG. 5 is a flow diagram illustrating methods 501 for fabricating an IC device including vertical thin film transistors, in accordance with some embodiments. Methods 501 begin at operation 205 where a substrate is received. The substrate advantageously includes a monocrystalline semiconductor layer, such as a silicon layer, upon which FETs may be formed. The FETs may be fabricated using any known technique and interconnected with BEOL metallization levels to form FET circuitry, such a peripheral circuitry of a memory device (e.g., DRAM). In some examples, both n-type and p-type FETs are fabricated upstream of methods 501 and interconnected into a CMOS peripheral circuit.

Methods 501 continue at operation 510 where gate features are fabricated, for example within BEOL metallization levels over FET circuitry. Any subtractive or additive fabrication techniques may be employed to fabricate gate features of any shape, such as, but not limited to lines, pillars, or polygonal mesas. Upon completion of operation 510, the gate features include a gate electrode covered with a gate dielectric. At operation 515, a spacer of semiconductor material is formed around a sidewall of the gate features. Any subtractive or additive fabrication techniques may be employed to fabricate the semiconductor spacer around the gate feature sidewall. In some embodiments, a non-selective semiconductor deposition process is employed at operation 515 to form a continuous semiconductor layer. A selective etch process may then be employed to remove the semiconductor layer from regions other than the sidewalls of the gate electrode features. The selective etch process may be maskless, for example relying on anisotropy of the etch to impart selectively between portions of the semiconductor layer on a sidewall of the feature and portions that are not on the sidewall. Alternatively, a mask may be employed to protect the portion of the semiconductor layer on the sidewall of the gate features. Upon the completion of operation 510, a cladding of semiconductor material is present on a sidewall of the gate feature(s).

Methods 501 continue at operation 520 where one or more isolation dielectric is deposited around the semiconductor cladded gate features. One or more layers of dielectric may be deposited by a conformal process, such as, but not limited to, chemical vapor deposition (CVD), or atomic layer deposition (ALD), for example. One or more layers of dielectric may be deposited by a non-conformal process, such as, but not limited to, spin-on techniques, and/or flowable CVD techniques, for example. Upon the completion of operation 520, semiconductor clad gate features are embedded in isolation dielectric.

Methods 501 continue at operation 525 where source and drain contact openings are formed. In some embodiments, at least two separate trenches are formed at operation 525, for example by etching into one or more of the isolation dielectric material layers. A mask may be employed at operation 525 to protect portions of the isolation dielectric that are not to be etched. The mask may have one or two openings aligned to the semiconductor clad gate features that define where the trenches are to be located relative to the gate features. Any dielectric etch process, such as an anisotropic dry (plasma) etch may be employed to etch into the isolation dielectric trenches of a predetermined target depth. The trenches formed may advantageously expose separate portions (e.g., two sidewall surfaces) of the semiconductor layer.

Methods 501 continue at operation 530 where contact metallization is formed. In some embodiments, the contact openings formed at operation 525 are backfilled with any suitable metal using any damascene techniques known. Methods 501 complete at operation 535 where terminals of the TFTs are interconnected into circuitry with one or more BEOL metallization levels using any known techniques.

Figure 6:
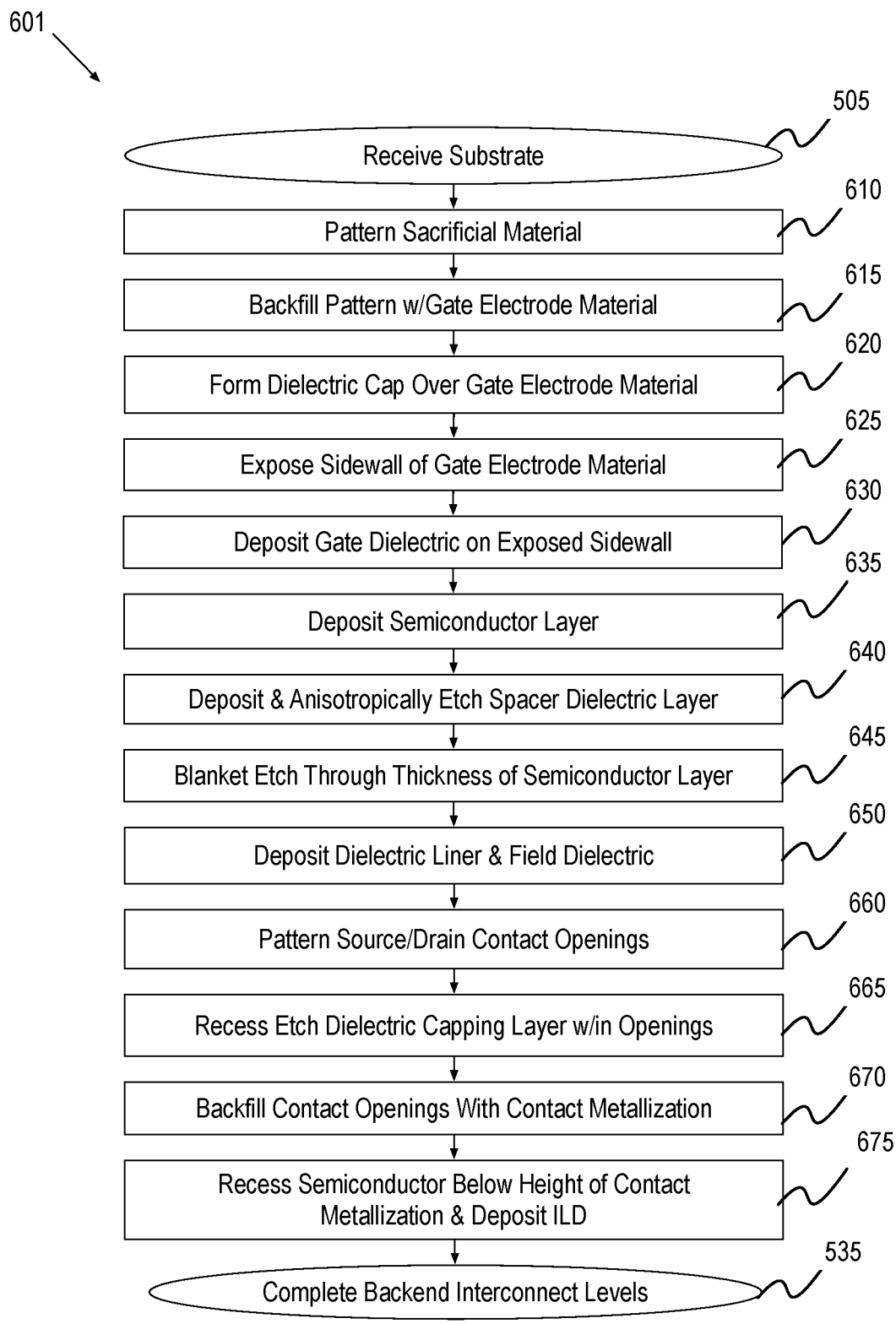
FIG. 6 is a flow diagram illustrating methods for fabricating vertical thin film transistor, in accordance with some embodiments of the methods shown in FIG. 5.
Figure 7:
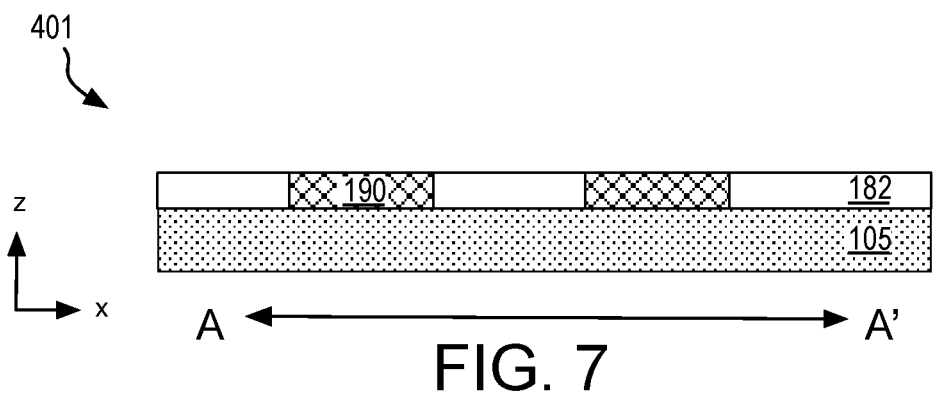
FIGS. 7, 8, 9, 10, 11, 12, 13, 14, 15, 16 and 17 illustrate cross-sectional views of thin film transistors evolving as operations in the method illustrated in FIG. 6 are performed, in accordance with some embodiments.
Figure 8:
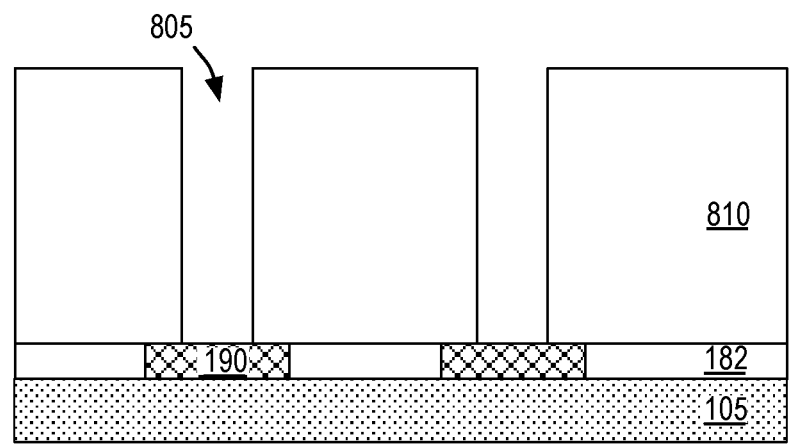
Figure 9:
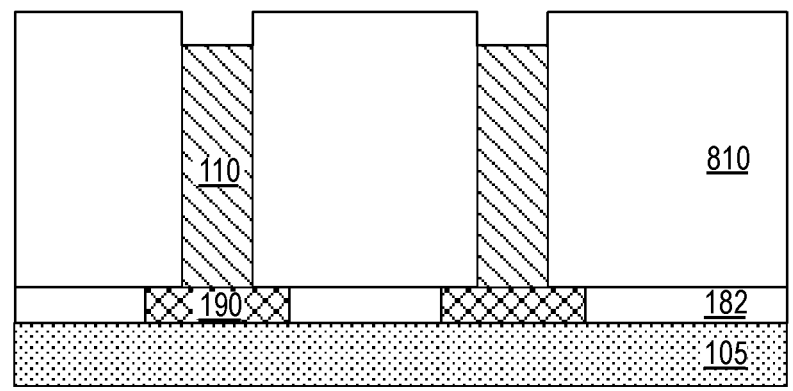

FIG. 6 is a flow diagram illustrating methods 601 for fabricating vertical thin film transistor, in accordance with some embodiments of the methods 501. FIG. 7-17 illustrate cross-sectional views of multi-gate thin film transistors of the memory device 401 (FIG. 4) taken along the dashed A-A' line. FIG. 7-17 further illustrate certain structural features evolving as operations in the methods 601 are performed, in accordance with some further embodiments.

Methods 601 begin at operation 505 where the substrate is received. The substrate may, for example, include peripheral circuitry of a memory device. The substrate received at operation 505 may have been processed upstream of methods 601, for example to fabricate FETs and one or more levels of BEOL interconnect metallization over the FETs. In the example further illustrated in FIG. 7, metallization (e.g., wordlines) 190 are embedded an ILD layer 182 (e.g., SiO$_2$ or a low-k material).

Returning to FIG. 6, methods 601 continue at operation 610, where a sacrificial material is deposited over the substrate and patterned. The patterned features are then backfilled with gate electrode material at operation 615, for example using any known damascene techniques. In the example further illustrated in FIG. 8, a sacrificial material layer 510 (e.g., SiO$_2$) has been deposited over ILD layer 182 and metallization 190. Other sacrificial materials, such as polysilicon, may be employed in a similar fashion. Openings 805 are etched into sacrificial layer 510, for example with an anisotropic etch process. Openings 805 expose a portion of metallization 190. As further shown in FIG. 9, gate electrode material 110 is deposited into openings 805. Any overburden may be removed from the top surface of sacrificial material layer 810, for example with a chemical-mechanical polish (CMP).

Figure 10:
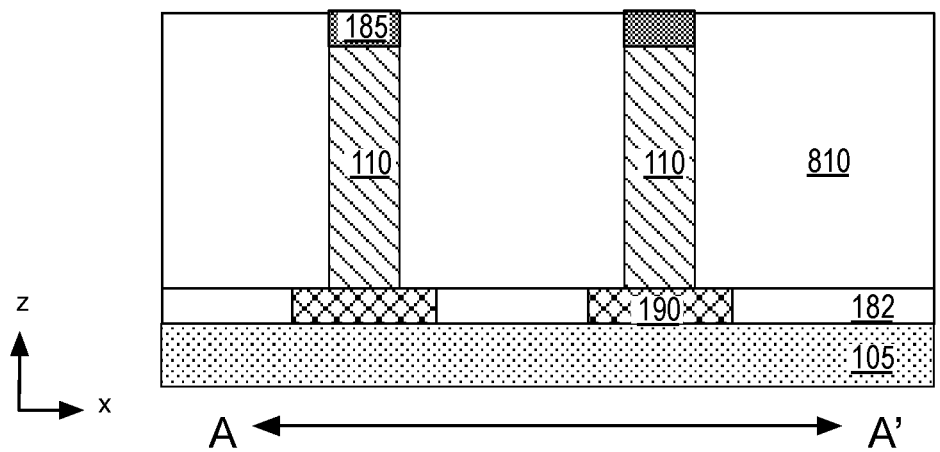
Figure 11:
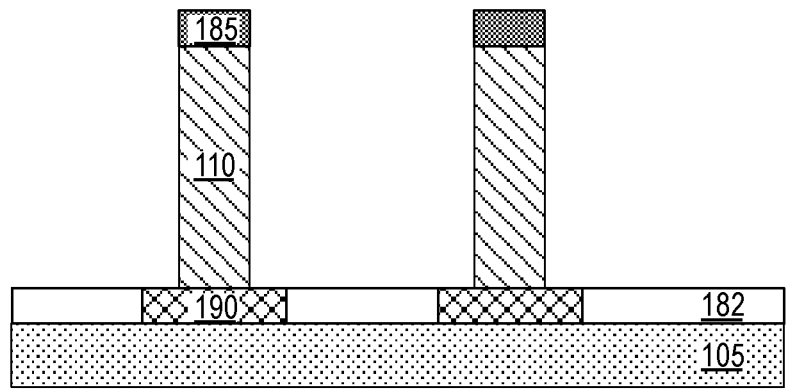

Returning to FIG. 6, methods 601 continue at operation 620 where a dielectric cap is formed over the gate electrode material. Such a cap may be deposited as a top layer of a gate electrode stack where the gate electrode is formed with a subtractive process. In the example shown in FIG. 9, a top surface of gate electrode material 110 is first recessed relative to a top surface of sacrificial material layer 810, for example with a selective etch process. A dielectric material layer is then deposited and planarized with the top surface of sacrificial layer 810 to arrive at the dielectric cap 185 as shown in FIG. 10.

Figure 12:
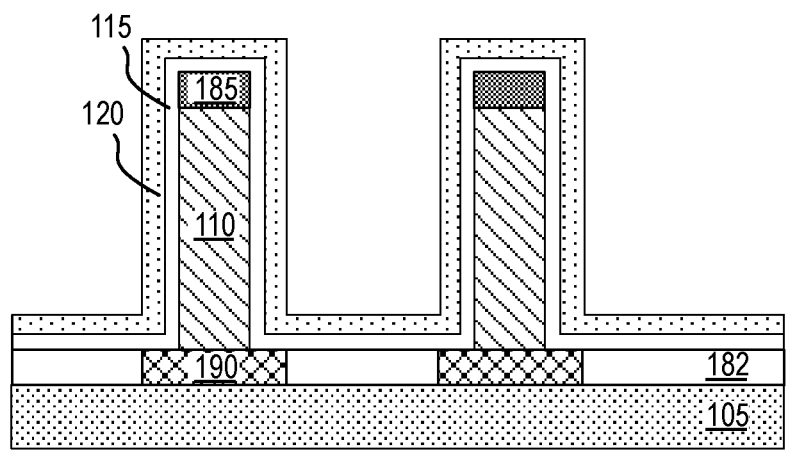
Figure 13:
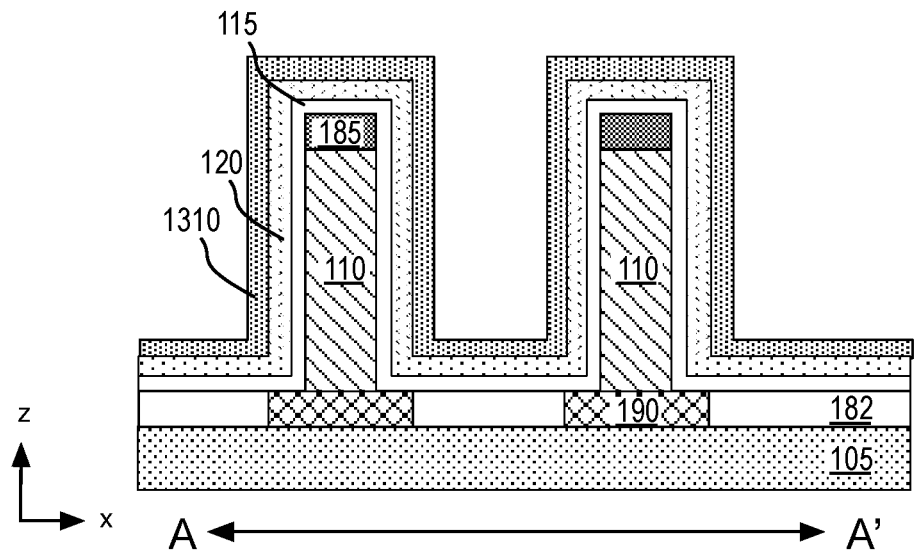

Returning to FIG. 6, methods 601 continue at operation 625 where the sacrificial material is removed to expose sidewalls of the gate electrode material. Once exposed, gate dielectric is deposited over the gate electrode at operation 630. A semiconductor layer is then deposited over the insulated gate at operation 635. In the example shown in FIG. 11, sacrificial material layer 810 has been removed with an etch process selective over dielectric cap 185, gate electrode material 110, and metallization 190. In FIG. 12, gate dielectric 115 has been deposited over the dielectric cap 185, over a sidewall of gate electrode material 110, over metallization 190, and over ILD layer 182. Semiconductor layer 120 has been further deposited over gate dielectric 115. Deposition of semiconductor layer 120 may entail any deposition process known to be suitable for the semiconductor composition and microstructure desired. For example, any of physical vapor deposition (PVD), chemical vapor deposition (CVD), e-beam deposition (EBD), or pulsed laser deposition (PLD) may be employed to deposit a thin film of semiconductor. In some embodiments where a layer of oxide semiconductor is deposited, any of the materials described above may be deposited as a blanket layer over the substrate.

Figure 14:
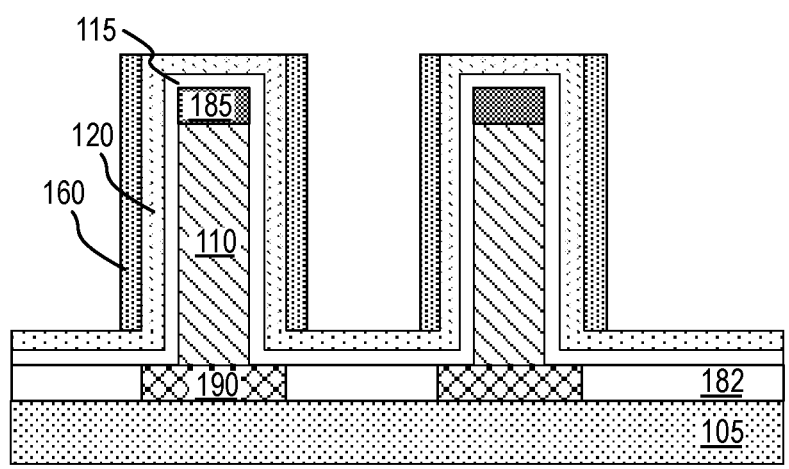
Figure 15:
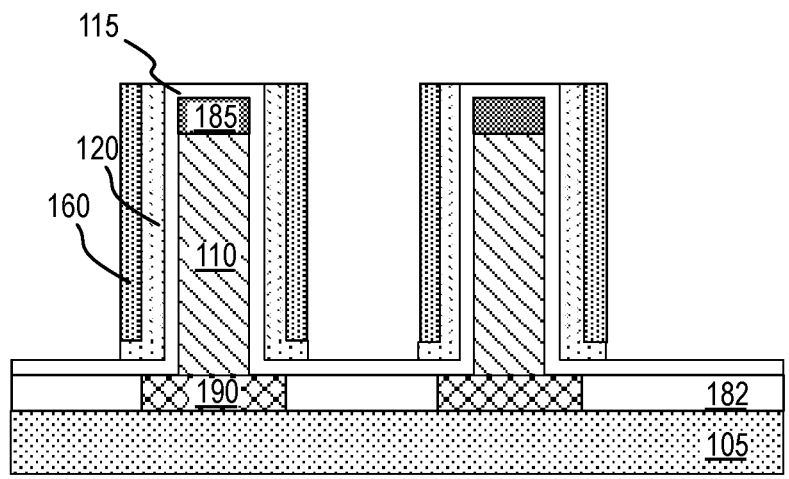
Figure 16:
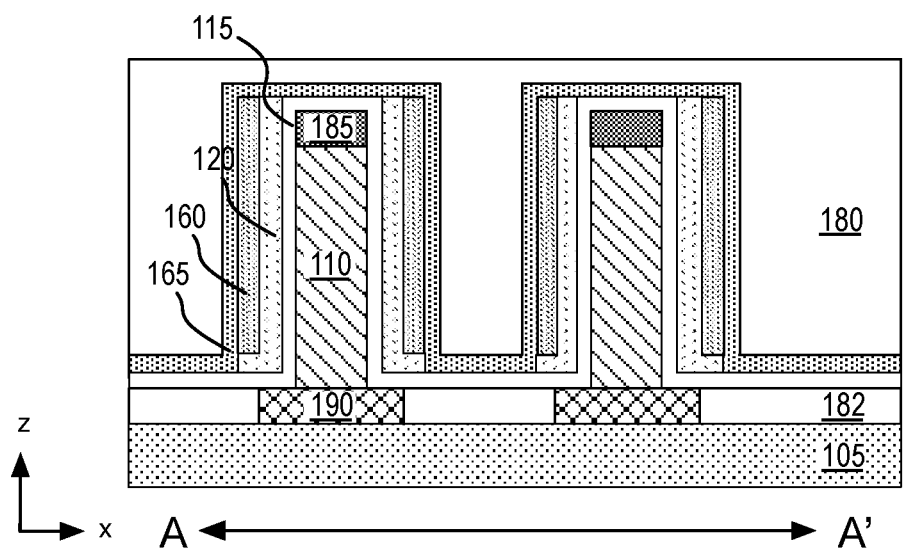
Figure 17:
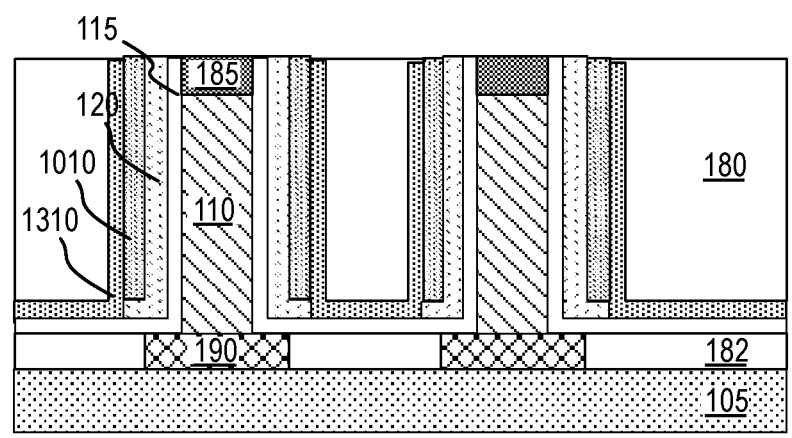

Returning to FIG. 6, methods 601 continue at operation 640 where a spacer dielectric layer is deposited over the semiconductor layer and anisotropically etched into a self-aligned dielectric spacer. While any dielectric material and etch process known may be employed, in some embodiments the spacer dielectric material is of a composition that provides good surface passivation of the underlying semiconductor layer. Good passivation of the semiconductor layer surface can advantageously reduce transistor leakage current (e.g., source-to-drain leakage). For some embodiments where the semiconductor layer deposited at operation 635 is an oxide semiconductor, an insulative metal oxide, such as any of those introduced above, is deposited at operation 640. In some embodiments, the spacer dielectric layer is deposited with a conformal deposition process (e.g., CVD or ALD). In the example further illustrated in FIG. 13, a spacer dielectric layer 1310 is deposited over semiconductor layer 120. FIG. 14 further illustrates dielectric spacer 160 following a maskless anisotropic "spacer" etch of dielectric layer 1310. As shown, dielectric spacer 160 remains only adjacent to sidewalls of topographic features, thereby protecting a portion of semiconductor layer 120 located over a sidewall of the dielectric insulated gate electrode.

Returning to FIG. 6, methods 601 continue at operation 645 where the semiconductor layer is etched through to localize the semiconductor to a finite region surrounding the gate electrode. In some embodiments, the semiconductor layer may be anisotropically etched. If such an etch is performed without a mask, a self-aligned spacer of semiconductor material may be formed around the topography of the gate electrode. In some other embodiments, the semiconductor layer may be isotropically etched and a mask employed to protect the semiconductor material around the gate electrode. In the example illustrated in FIG. 15, portions of semiconductor layer 120 unprotected by dielectric spacer 160 are removed (e.g., by anisotropic and/or isotropic etch). Notably, no lithographic patterning is required and this self-aligned patterning offers the advantage of scalability. Etching through semiconductor layer 120 electrically isolates one semiconductor layer 120 over a first gate electrode from another semiconductor layer 120 over a second, adjacent, gate electrode.

Returning to FIG. 6, methods 601 continue at operation 650 where a liner dielectric is deposited over the semiconductor clad and insulated gate electrode features. Such a liner dielectric may advantageously passivate portions of semiconductor layer 120 left exposed after the semiconductor etch process of operation 645. The composition of the liner dielectric may therefore advantageously have the same composition as the spacer dielectric formed at operation 640. In some advantageous embodiments, the liner dielectric is deposited with a conformal deposition process (e.g., CVD or ALD). The same deposition process employed at operation 640 may be employed at operation 650, for example. Following the liner deposition, a field dielectric is deposited to backfill regions between topographic features with an insulative material. The field dielectric may be deposited with any non-conformal process (e.g., spin-on or other flowable oxide deposition techniques). In some advantageous embodiments, the field dielectric deposited has a different composition than the liner dielectric. A flowable oxide material may be deposited, for example. As further shown in the example of FIG. 16, a dielectric liner 165 has been conformally deposited and field dielectric 180 has been non-conformally deposited, substantially backfilling a portion of the space between two adjacent gate electrodes 110. The pitch of gate electrodes 110 is therefore sufficient to ensure a space between adjacent gate electrodes 110 is large enough for there to be field dielectric 180 separating the conformal dielectric liner 165 over each gate electrode 110. A planarization (e.g., CMP) process may then remove field dielectric overburden and expose top surfaces of dielectric liner 165, and/or gate dielectric 115, and/or dielectric cap 185. In the example shown in FIG. 17, the dielectric is recessed or etched back until dielectric cap 185 is exposed. One or more selective or non-selective planarization or recess etch processes may be employed to stop upon dielectric cap 185 and any processes known to be suitable for the chosen material compositions may be employed.

Figure 18:
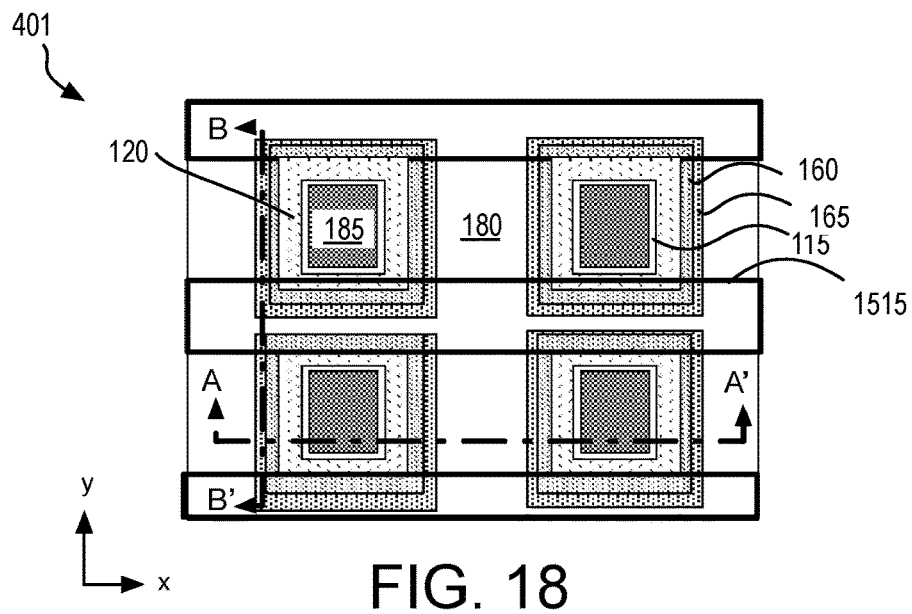
FIG. 18 is a top-down plan view of a vertical thin film transistor array, in accordance with some embodiments.

Returning to FIG. 6, methods 601 continue at operation 660 where source and drain contact openings are patterned into one or more of the dielectric material layers surrounding the semiconductor clad insulated gate electrodes. In some embodiments, a lithographic patterning process is performed to define a stripe or other polygonal opening in a masking layer formed over the gate electrode structures. The mask opening may expose only a portion of the surrounding dielectric material. Two discontinuous portions of the dielectric material surrounding any given gate electrode structure may be exposed by a single mask opening as a result of the mask opening's intersection with the semiconductor clad gate electrodes. FIG. 18 is a top-down plan view of vertical thin film transistor memory device 401, in accordance with some embodiments. As shown, a lithographically-defined mask includes mask stripes 1515 that cross over one or more transistor structures. Each mask stripe 1515 has an edge that crosses over or overlaps semiconductor layer 120, thereby protecting ends of dielectric surrounding each transistor structure.

Figure 19A:
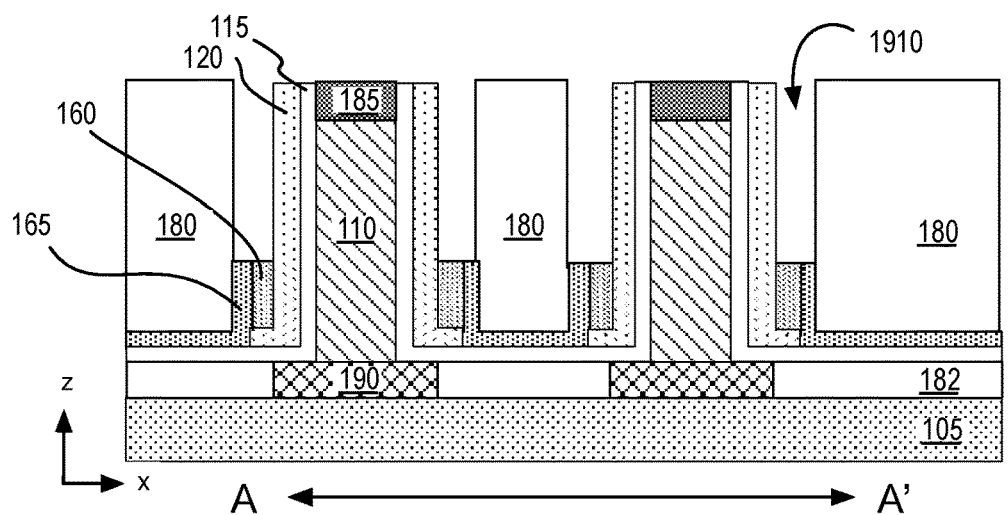
FIGS. 19A, 20A, and 21A illustrate cross-sectional views of vertical thin film transistors evolving as operations in the method illustrated in FIG. 6 are performed, in accordance with some embodiments.
Figure 19B:
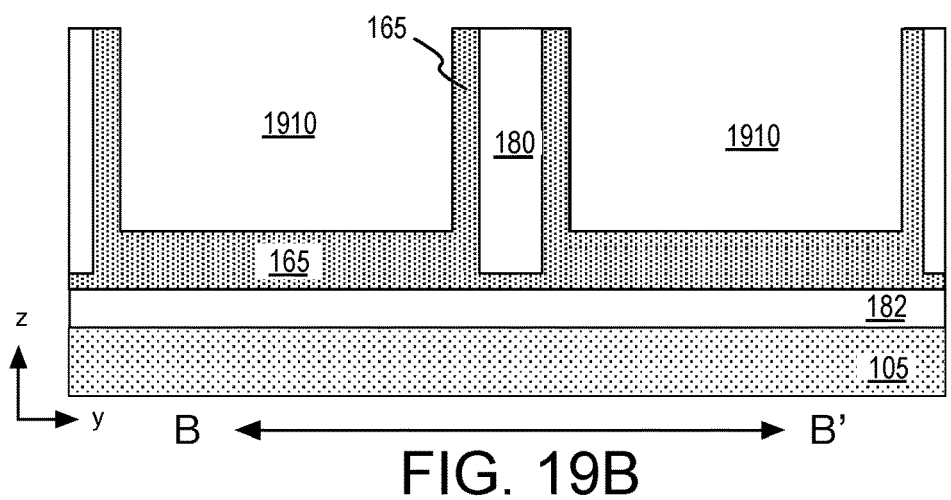
FIGS. 19B, 20B, and 21B illustrate cross-sectional views of vertical thin film transistors evolving as operations in the method illustrated in FIG. 6 are performed, in accordance with some embodiments.

Returning to FIG. 6, methods 601 continue at operation 665 where the exposed portions of dielectric are recess etched to form trenches that expose a sidewall of the semiconductor layer. In some embodiments, the recess etch is selective to one or more of the dielectric materials exposed within the mask openings. Such an etch process is therefore at least partially self-aligned. The contact etch may be terminated at any time with the depth of the trench determining how much of the semiconductor layer is exposed. The trench depth defines how much overlap there will be between the source/drain contacts and the gate electrode, thereby impacting the effective channel width of the transistor. In some embodiments, the contact etch is landed on a dielectric layer. FIG. 19A illustrates a cross-sectional view of multi-gate thin film transistor memory device 401 along the A-A' line shown in FIG. 18 following an etch process that selectively recesses dielectric spacer 160 and dielectric liner 165 relative to a top surface of field dielectric 180. In this example, the contact etch has been terminated after a predetermined etch time, so that contact trench 1910 has a depth less than the height of gate electrode 110 and dielectrics 160 and 165 are present at the bottom of trench 1910. The contact etch may alternatively land on gate dielectric 115 or any other underlying dielectric if there is sufficient etch selectively to ensure metallization 190 is not exposed. FIG. 19B illustrates a cross-sectional view of multi-gate thin film transistor memory device 401 along the B-B' line shown in FIG. 18 following the contact etch process. As shown in FIG. 19A, contact trench 1910 is self-aligned to semiconductor layer 120 and field dielectric 180. As shown in FIG. 19B, the mask stripes confine each trench 1910 to a discrete portion of the dielectric spacer 160 and/or dielectric liner 165.

Figure 20A:
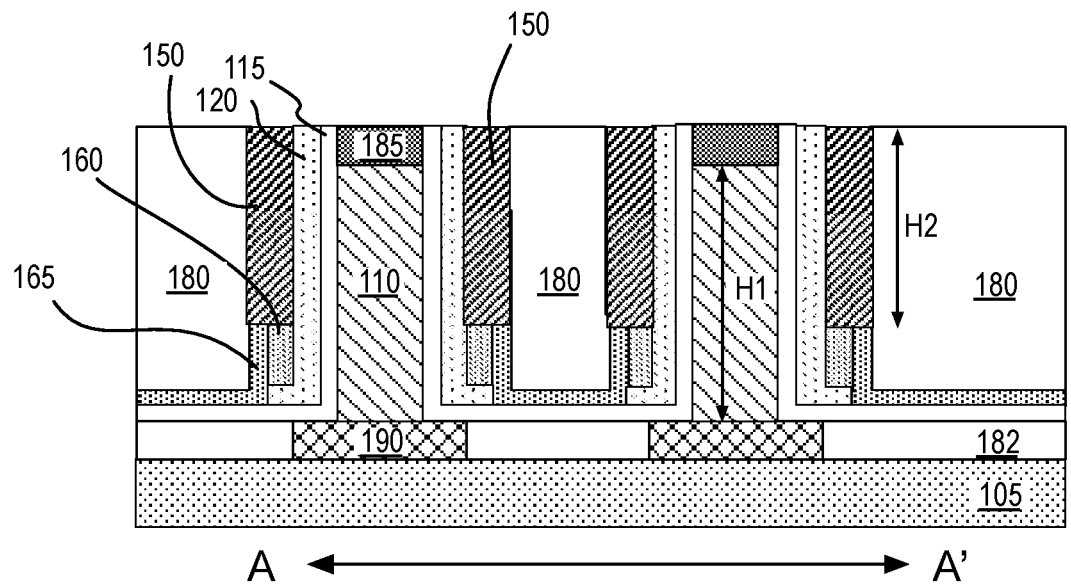
Figure 20B:
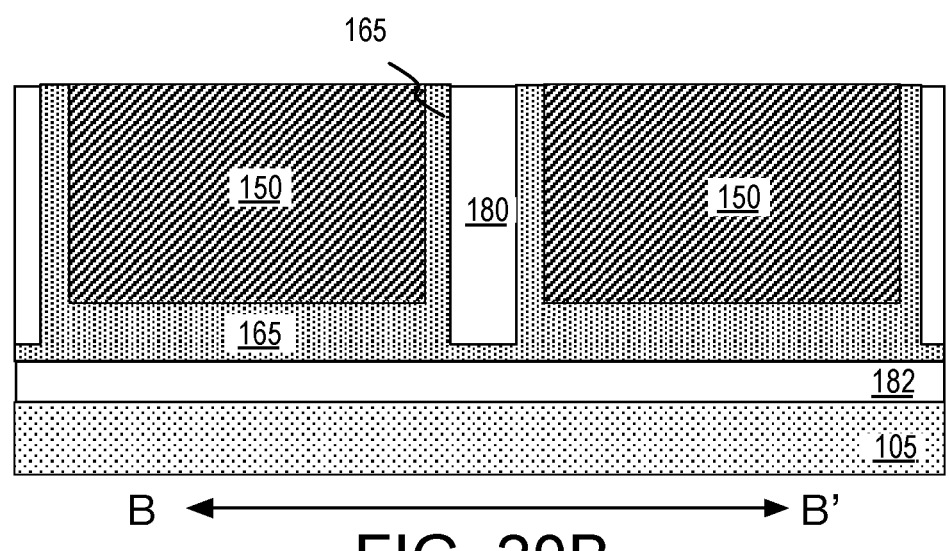

Returning to FIG. 6, methods 601 continue at operation 670 where the contact trench formed at operation 665 is backfilled with any suitable contact metallization. Any known damascene technique may be employed at operation 670, for example. In the example illustrated by FIG. 20A (A-A' cross-section) and FIG. 20B (B-B' cross-section), source and drain contact metallization 150 has been deposited and any overburden planarized with a top surface of field dielectric 180 and/or dielectric cap 185. The resulting pairs of contact metallizations contacting the semiconductor layer 120 surrounding each gate electrode 110 may then be separately interconnected as distinct nodes of an IC. As shown, contact metallization has a height H2, which is a function of the trench etch depth. Metallization height H2 is less than gate electrode height H1 and the effective transistor channel width is a function of the overlap of H1 and H2.

Figure 21A:
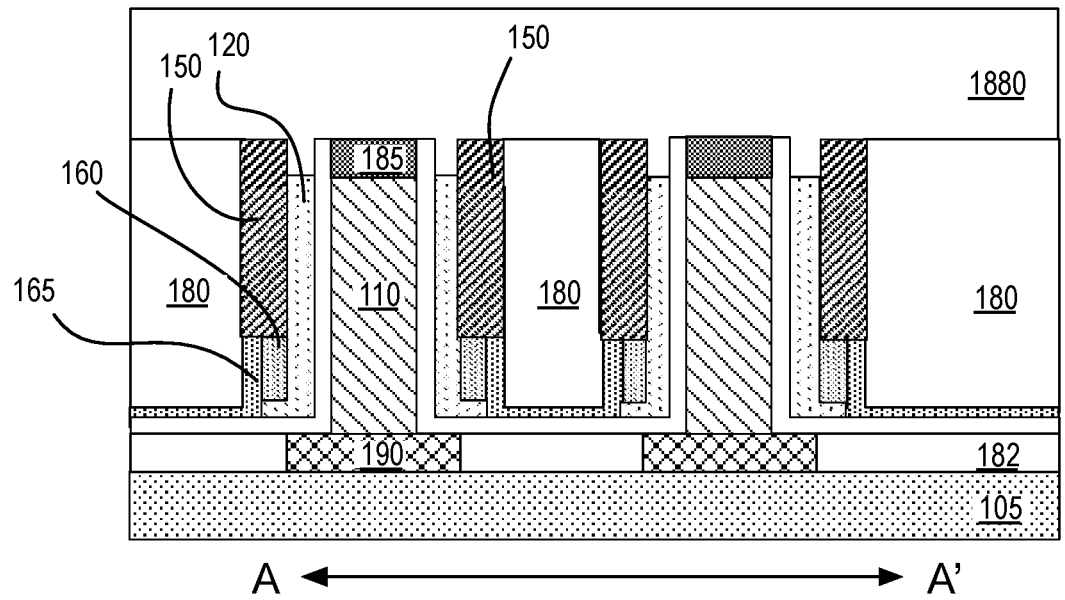
Figure 21B:
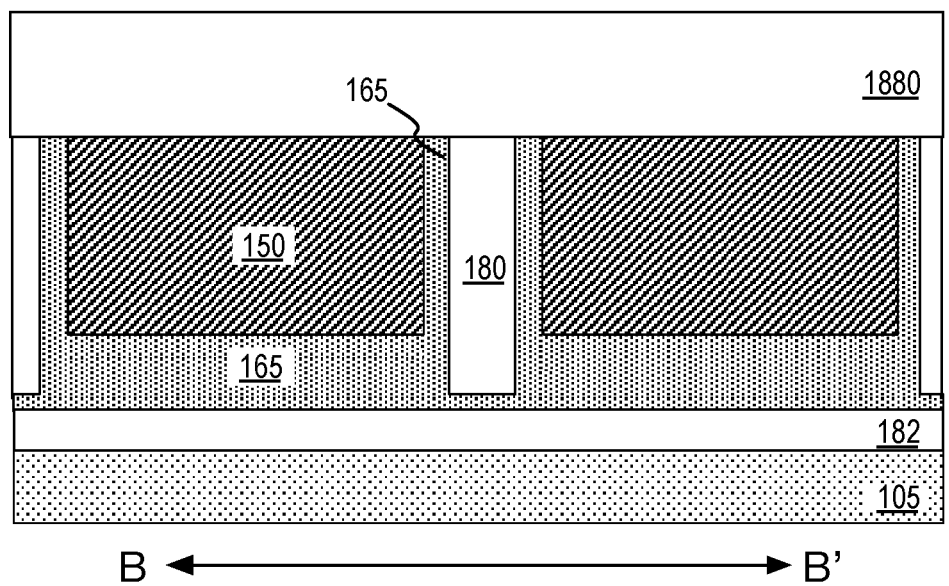

Returning to FIG. 6, methods 601 continue at operation 675 where the semiconductor layer is recessed relative to surrounding dielectric and/or contact metallization. Although optional, operation 675 may facilitate subsequent deposition of a passivation layer over the recessed surface of the semiconductor layer, and/or may facilitate subsequent electrical interconnection of the contact metallization. A timed etch selective to the semiconductor layer may be performed at operation 675, for example. Backend interconnect levels may then be completed using any known techniques. In the example illustrated in FIG. 21A (A-A' cross-section) and FIG. 21B (B-B' cross-section), ILD 1880 has been deposited over the transistor structures, backfilling the recessed top surface of semiconductor layer 120. In some embodiments ILD 1880 has the same composition as dielectric spacer 160 and/or dielectric liner 165 to passivate the recessed semiconductor layer surface. The transistor structures as shown FIGS. 21A and 21B are therefore substantially as introduced in FIGS. 1A and 1B and are amenable to any further processing suitable for interconnecting transistors into integrated circuitry.

Figure 22:
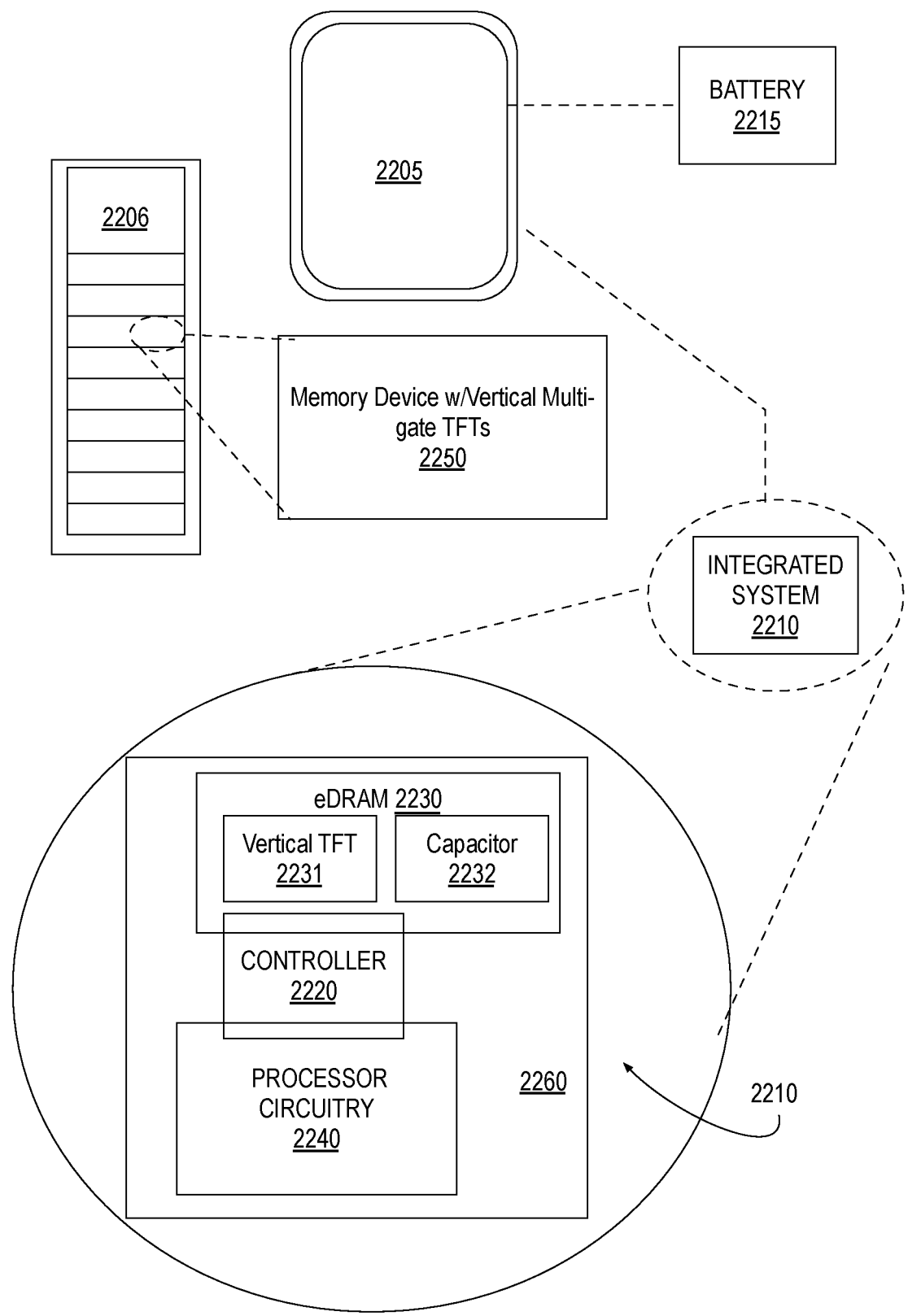
FIG. 22 illustrates a mobile computing platform and a data server machine including a vertical TFTs, in accordance with some embodiments.

FIG. 22 illustrates a mobile computing platform and a data server machine employing a memory device 2250 including BEOL TFTs, for example as described elsewhere herein. The server machine 2206 may be any commercial server, for example including any number of high-performance computing platforms disposed within a rack and networked together for electronic data processing, which in the exemplary embodiment includes a vertical TFT in accordance with any of the embodiments described above. In some embodiments the vertical TFT is one in a packaged monolithic or MCM IC-eDRAM device. The mobile computing platform 2205 may be any portable device configured for each of electronic data display, electronic data processing, wireless electronic data transmission, or the like. For example, the mobile computing platform 2205 may be any of a tablet, a smart phone, laptop computer, etc., and may include a display screen (e.g., a capacitive, inductive, resistive, or optical touchscreen), a chip-level or package-level integrated system 2210, and a battery 2215.

Disposed within the integrated system 2210, a substrate 2260 includes an eDRAM 2230 and processor circuitry 2240 (e.g., a microprocessor, a multi-core microprocessor, graphics processor, or the like). eDRAM 2230 includes 1C-1TFT cells, with each cell including a vertical TFT 2231 and a BEOL capacitor 2232, for example having one or more of the features of the transistor structures described elsewhere herein. For monolithic embodiments, substrate 2260 is a semiconductor chip. For MCM embodiments, substrate 2260 may be any package substrate, or an interposer. Processor circuitry 2240, or a separate RFIC chip may be further coupled to an antenna (not shown) to implement any of a number of wireless standards or protocols, including but not limited to Wi-Fi (IEEE 1402.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 23:
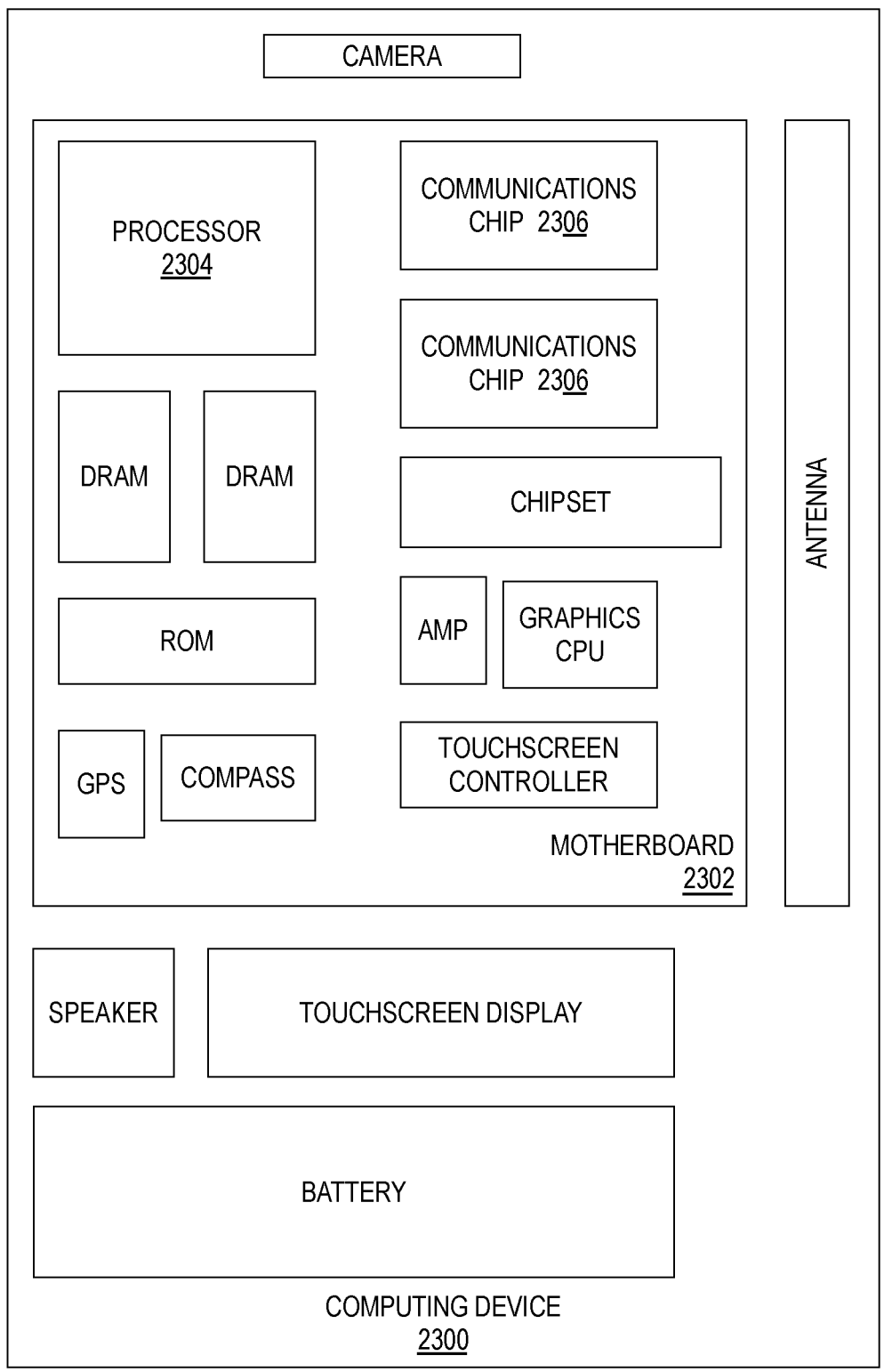
FIG. 23 is a functional block diagram of an electronic computing device, in accordance with some embodiments.

FIG. 23 is a functional block diagram of an electronic computing device, in accordance with some embodiments. Computing device 2300 may be found inside platform 2205 or server machine 2206, for example. Device 2300 further includes a motherboard 2302 hosting a number of components, such as, but not limited to, a processor 2304 (e.g., an applications processor). Processor 2304 may be physically and/or electrically coupled to motherboard 2302. In some examples, processor 2304 includes an integrated circuit die packaged within the processor 2304. In general, the term "processor" or "microprocessor" may refer to any device or portion of a device that processes electronic data from registers and/or memory to transform that electronic data into other electronic data that may be further stored in registers and/or memory.

In various examples, one or more communication chips 2306 may also be physically and/or electrically coupled to the motherboard 2302. In further implementations, communication chips 2306 may be part of processor 2304. Depending on its applications, computing device 2300 may include other components that may or may not be physically and electrically coupled to motherboard 2302, and/or packaged with processor 2304, and/or monolithically integrated with processor 2304. These other components include, but are not limited to, volatile memory (e.g., eDRAM that may further incorporate at least one vertical TFT structure as described elsewhere herein), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 2306 may enable wireless communications for the transfer of data to and from the computing device 2300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 2306 may implement any of a number of wireless standards or protocols, including but not limited to those described elsewhere herein. As discussed, computing device 2300 may include a plurality of communication chips 2306. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In one or more first examples, a vertical thin film transistor comprises a gate electrode extending from an underlying material surface, a gate dielectric over a sidewall of the gate electrode. A semiconductor layer is over the gate dielectric material, the semiconductor layer separated from the sidewall of the gate electrode by at least the gate dielectric. The transistor comprises one or more isolation dielectric materials surrounding the semiconductor layer, a first contact metallization in contact with a first portion of the semiconductor layer, and a second contact metallization in contact with a second portion of the semiconductor layer.

In one or more second examples, for any of the first examples the gate dielectric comprises a cladding surrounding the gate electrode, the semiconductor layer comprises a cladding surrounding the gate dielectric, the one or more isolation dielectric materials comprise a cladding surrounding the semiconductor layer, and a portion of the semiconductor layer between the gate dielectric and the isolation dielectric materials separates the first contact metallization from the second contact metallization.

In one or more third examples, for any of the first or second examples the semiconductor layer comprises an oxide, the gate dielectric comprises a metal oxide, and the one or more isolation dielectric materials comprise at least a first dielectric and a second dielectric surrounding the first dielectric.

In one or more fourth examples, for any of the first through third examples the first contact metallization is within a first trench in at least the first dielectric layer, a wall of the first trench comprising the second dielectric, and the second contact metallization is within a second trench in at least the first dielectric layer, a wall of the second trench comprising the second dielectric.

In one or more fifth examples, for any of the fourth examples the first dielectric is separated from the semiconductor layer by one or more intervening dielectric layers. The first trench is in the first dielectric layer and the one or more intervening dielectric layers. The second trench is in the first dielectric layer and the one or more intervening dielectric layers.

In one or more sixth examples, for any of the first examples the gate electrode has a first height as measure from the underlying surface. The first and second contact metallizations contact the semiconductor layer along a top portion of the first height. The isolation dielectric materials contact the semiconductor layer along a bottom portion of the first height, between the top portion and the underlying surface.

In one or more seventh examples, for any of the sixth examples a top surface of the semiconductor layer is recessed below a top surface of the first and second contact metallizations. The gate electrode has a first height as measure from the underlying surface. The first and second contact metallizations have a second height, less than the first height.

In one or more eighth examples, for any of the seventh examples the semiconductor layer is separated from the underlying surface by the gate dielectric, and a top surface of the gate electrode In one or more ninth examples, for any of the first examples the transistor further comprises a second gate electrode extending from the underlying material surface. The gate dielectric comprises a first cladding surrounding the gate electrode and a second cladding surrounding the second gate electrode. The semiconductor layer surrounds the first cladding and the second cladding. The one or more dielectric materials comprise a cladding surrounding the semiconductor layer. A first portion of the semiconductor layer between the first and second gate electrodes separates the first contact metallization from the second contact metallization.

In one or more tenth examples, for any of the ninth examples a longitudinal length of at least one of the contact metallizations is at least equal to that of the first gate electrode summed with that of the second gate electrode.

In one or more eleventh examples, a computer platform includes one or more processor, and a memory device coupled to the processor, wherein at least one of the processor and memory device comprises the thin film transistor in any of the first through tenth examples.

In one or more twelfth examples, an integrated circuit memory device comprises a memory cell array including a plurality of thin film transistors (TFTs), wherein individual ones of the TFTs comprise a gate electrode extending from an underlying material surface, a gate dielectric over a sidewall of the gate electrode, a semiconductor layer over the gate dielectric, the semiconductor layer separated from the sidewall of the gate electrode by at least the gate dielectric, one or more isolation dielectric materials surrounding the semiconductor layer, a first contact metallization in contact with a first portion of the semiconductor layer, and a second contact metallization in contact with a second portion of the semiconductor layer.

In one or more thirteenth examples, for any of the twelfth examples the underlying material surface further comprises an inter-level dielectric (ILD) layer over a substrate including a plurality of metal-oxide-semiconductor field effect transistors (MOSFETs) employing a monocrystalline semiconductor.

In one or more fourteenth examples, for any of the thirteenth examples at least the gate electrode is electrically coupled to one of the MOSFETs through a wordline.

In one or more fifteenth examples, a method of fabricating a thin film transistor (TFT) comprises forming a gate pillar extending from an underlying material surface, the gate pillar comprising a gate dielectric on a sidewall of a gate electrode material. The method comprises forming a semiconductor layer over a sidewall of the pillar, the semiconductor layer covering the gate dielectric on the sidewall of the pillar. The method comprises forming one or more dielectric materials around the pillar. The method comprises forming a pair of openings in the dielectric materials, each opening exposing a portion of the semiconductor layer. The method comprises forming contact metallization within the openings.

In one or more sixteenth examples, for any of the fifteenth examples forming the gate pillar comprises patterning a feature into a sacrificial material layer, backfilling the feature with the gate electrode material, removing the sacrificial material layer to expose the sidewall of the gate electrode material, and depositing the gate dielectric over the exposed sidewall of the gate electrode material.

In one or more seventeenth examples, forming the gate pillar comprises recessing a top surface of the gate electrode material from a top surface of the sacrificial material layer, and forming a dielectric cap over the recessed top surface of the gate electrode material, wherein the dielectric cap has a composition distinct from that of the sacrificial material layer.

In one or more eighteenth examples, for any of the fifteenth examples forming the semiconductor layer comprises depositing a semiconductor material comprising atomic oxygen.

In one or more nineteenth examples, for any of the eighteenth examples forming the semiconductor layer comprises blanket depositing the semiconductor layer over the pillar and the underlying material surface, and removing the semiconductor layer from at least a portion of the underlying material surface adjacent to the pillar.

In one or more twentieth examples, for any of the nineteenth examples removing the semiconductor layer from the underlying material surface further comprises depositing a spacer dielectric over the semiconductor layer, anisotropically etching the spacer dielectric to form a dielectric spacer protecting the semiconductor layer covering the gate dielectric material on the sidewall, and removing the semiconductor layer unprotected by the dielectric spacer.

In one or more twenty-first examples, for any of the twentieth examples forming one or more dielectric materials around the pillar further comprises depositing a first dielectric layer over the spacer dielectric and depositing a second dielectric layer over the first dielectric layer, and planarizing the first and second dielectric layers with the pillar to expose the dielectric spacer. Forming the pair of openings comprises recessing the first dielectric layer and the dielectric spacer selectively to the second dielectric layer.

In one or more twenty-second examples, for any of the twenty-first examples the spacer dielectric comprises a metal oxide.

In one or more twenty-third examples, for any of the fifteenth through twenty-second examples forming one or more dielectric materials around the pillar further comprises depositing a first dielectric layer over the pillar and a second dielectric layer over the first dielectric layer, and planarizing the first and second dielectric layers with the pillar to expose the dielectric spacer. Forming the pair of openings comprises recessing the first dielectric layer selectively to the second dielectric layer, the recessing of the first dielectric layer exposing the portion of the semiconductor layer.

In one or more twenty-fourth examples, for any of the fifteenth through twenty-second examples the method further includes recessing the semiconductor layer below a top surface of the contact metallization, and depositing a dielectric material over the recessed semiconductor layer.

In one or more twenty-fifth examples, for any of the twenty-fourth examples the dielectric material deposited over the recessed semiconductor layer comprises a metal oxide.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A vertical thin film transistor, comprising:
a gate electrode extending from an underlying material;
a gate dielectric over a sidewall of the gate electrode;
a semiconductor layer over the gate dielectric, the semiconductor layer separated from the sidewall of the gate electrode by at least the gate dielectric;
one or more isolation dielectric materials surrounding the semiconductor layer;
a first contact metallization in contact with a first portion of the semiconductor layer; and
a second contact metallization in contact with a second portion of the semiconductor layer.

2. The transistor of claim 1, wherein:
the gate dielectric comprises a cladding surrounding the gate electrode;
the semiconductor layer comprises a cladding surrounding the gate dielectric;
the one or more isolation dielectric materials comprise a cladding surrounding the semiconductor layer; and
a portion of the semiconductor layer between the gate dielectric and the isolation dielectric materials separates the first contact metallization from the second contact metallization.

3. The transistor of claim 1, wherein:
the semiconductor layer comprises an oxide;
the gate dielectric comprises a metal oxide; and
the one or more isolation dielectric materials comprise at least a first dielectric and a second dielectric surrounding the first dielectric.

4. The transistor of claim 3, wherein:
the first contact metallization is within a first trench in at least the first dielectric layer, a wall of the first trench comprising the second dielectric; and
the second contact metallization is within a second trench in at least the first dielectric layer, a wall of the second trench comprising the second dielectric.

5. The transistor of claim 4, wherein:
the first dielectric is separated from the semiconductor layer by one or more intervening dielectric layers;
the first trench is in the first dielectric layer and the one or more intervening dielectric layers; and
the second trench is in the first dielectric layer and the one or more intervening dielectric layers.

6. The transistor of claim 1, wherein:
the gate electrode has a first height from the underlying material;
the first and second contact metallizations are in contact with the semiconductor layer along a top portion of the first height; and
the isolation dielectric materials are in contact with the semiconductor layer along a bottom portion of the first height, between the top portion and the underlying material.

7. The transistor of claim 6, wherein:
a top surface of the semiconductor layer is recessed below a top surface of the first and second contact metallizations;

the gate electrode has a first height from the underlying material; and
the first and second contact metallizations have a second height, less than the first height.

8. The transistor of claim 7, wherein the semiconductor layer is separated from the underlying material by the gate dielectric.

9. The transistor of claim 1, further comprising:
a second gate electrode extending from the underlying material; and
wherein:
the gate dielectric comprises a first cladding surrounding the gate electrode and a second cladding surrounding the second gate electrode;
the semiconductor layer surrounds the first cladding and the second cladding;
the one or more dielectric materials comprise a cladding surrounding the semiconductor layer; and
a first portion of the semiconductor layer between the first and second gate electrodes separates the first contact metallization from the second contact metallization.

10. The transistor of claim 9, wherein a longitudinal length of at least one of the contact metallizations is at least equal to that of the first gate electrode summed with that of the second gate electrode.

11. A computer platform including:
a processor; and
a memory device coupled to the processor, wherein at least one of the processor and memory device comprises the thin film transistor recited in claim 1.

12. An integrated circuit memory device, comprising:
a memory cell array including a plurality of thin film transistors (TFTs), wherein individual ones of the TFTs comprise:
a gate electrode extending from an underlying material surface;
a gate dielectric over a sidewall of the gate electrode;
a semiconductor layer over the gate dielectric, the semiconductor layer separated from the sidewall of the gate electrode by at least the gate dielectric;
one or more isolation dielectric materials surrounding the semiconductor layer;
a first contact metallization in contact with a first portion of the semiconductor layer; and
a second contact metallization in contact with a second portion of the semiconductor layer.

13. The memory device of claim 12, wherein the underlying material surface further comprises an inter-level dielectric (ILD) layer that is over a substrate, the substrate including a plurality of metal-oxide-semiconductor field effect transistors (MOSFETs) comprising a monocrystalline semiconductor material.

14. The memory device of claim 13, wherein at least the gate electrode is electrically coupled to one of the MOSFETs through a wordline.

15. A method of fabricating a thin film transistor (TFT), the method comprising:
forming a gate pillar extending from an underlying material, the gate pillar comprising a gate dielectric on a sidewall of a gate electrode material;
forming a semiconductor layer over a sidewall of the gate pillar, the semiconductor layer covering the gate dielectric on the sidewall of the gate pillar;
forming one or more dielectric materials around the gate pillar;

forming a pair of openings in the dielectric materials, each opening exposing a portion of the semiconductor layer; and forming contact metallization within the openings.

16. The method of claim 15, wherein forming the gate pillar comprises:
patterning a feature into a sacrificial material layer;
backfilling the feature with the gate electrode material;
removing the sacrificial material layer to expose the sidewall of the gate electrode material; and
depositing the gate dielectric over the exposed sidewall of the gate electrode material.

17. The method of claim 16, wherein forming the gate pillar comprises:
recessing a top surface of the gate electrode material from a top surface of the sacrificial material layer; and
forming a dielectric cap over the recessed top surface of the gate electrode material, wherein the dielectric cap has a composition distinct from that of the sacrificial material layer.

18. The method of claim 15, wherein forming the semiconductor layer comprises depositing a semiconductor material comprising oxygen.

19. The method of claim 18, wherein forming the semiconductor layer comprises:
blanket depositing the semiconductor layer over the gate pillar and the underlying material; and
removing the semiconductor layer from at least a portion of the underlying material adjacent to the gate pillar.

20. The method of claim 19, wherein removing the semiconductor layer from the underlying material further comprises:
depositing a spacer dielectric over the semiconductor layer;
anisotropically etching the spacer dielectric to form a dielectric spacer protecting the semiconductor layer covering the gate dielectric material on the sidewall; and
removing the semiconductor layer unprotected by the dielectric spacer.

21. The method of claim 20, wherein:
forming one or more dielectric materials around the gate pillar further comprises:
depositing a first dielectric layer over the spacer dielectric and depositing a second dielectric layer over the first dielectric layer; and
planarizing the first and second dielectric layers with the gate pillar to expose the dielectric spacer; and
forming the pair of openings comprises recessing the first dielectric layer and the dielectric spacer selectively to the second dielectric layer.

22. The method of claim 21, wherein the spacer dielectric comprises a metal oxide.

23. The method of claim 15, wherein:
forming one or more dielectric materials around the gate pillar further comprises:
depositing a first dielectric layer over the gate pillar and a second dielectric layer over the first dielectric layer; and
planarizing the first and second dielectric layers with the gate pillar to expose the dielectric spacer; and
forming the pair of openings comprises recessing the first dielectric layer selectively to the second dielectric layer, the recessing of the first dielectric layer exposing the portion of the semiconductor layer.

24. The method of claim 15, further comprising:
recessing the semiconductor layer below a top surface of the contact metallization; and
depositing a dielectric material over the recessed semiconductor layer.

25. The method of claim 24, wherein the dielectric material deposited over the recessed semiconductor layer comprises a metal oxide.

* * * * *